United States Patent
Yoon et al.

(10) Patent No.: US 12,156,347 B2
(45) Date of Patent: Nov. 26, 2024

(54) JIG FOR VIA-HOLE PROCESSING, VIA-HOLE PROCESSING DEVICE, AND VIA-HOLE PROCESSING METHOD USING SAME

(71) Applicant: LG INNOTEK CO., LTD., Seoul (KR)

(72) Inventors: Jong Heum Yoon, Seoul (KR); Jee Hee Lim, Seoul (KR); Hong Ik Kim, Seoul (KR); Se Woong Na, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 804 days.

(21) Appl. No.: 17/296,011

(22) PCT Filed: Nov. 14, 2019

(86) PCT No.: PCT/KR2019/015538
§ 371 (c)(1),
(2) Date: May 21, 2021

(87) PCT Pub. No.: WO2020/105957
PCT Pub. Date: May 28, 2020

(65) Prior Publication Data
US 2022/0015245 A1    Jan. 13, 2022

(30) Foreign Application Priority Data

| Nov. 21, 2018 | (KR) | 10-2018-0144644 |
| Nov. 21, 2018 | (KR) | 10-2018-0144670 |
| Nov. 21, 2018 | (KR) | 10-2018-0144698 |

(51) Int. Cl.
*H05K 3/40* (2006.01)
*B23K 26/38* (2014.01)
(Continued)

(52) U.S. Cl.
CPC ........ *H05K 3/4038* (2013.01); *B23K 26/382* (2015.10); *H05K 3/0026* (2013.01)

(58) Field of Classification Search
None
See application file for complete search history.

(56) References Cited

U.S. PATENT DOCUMENTS

| 6,057,180 A | * | 5/2000 | Sun | H01L 21/76894 438/131 |
| 8,336,188 B2 | * | 12/2012 | Monteen | H01L 21/6838 269/21 |

(Continued)

FOREIGN PATENT DOCUMENTS

| JP | 8-116174 A | 5/1996 |
| JP | 2009-004430 A | 1/2009 |

(Continued)

OTHER PUBLICATIONS

Machine translation of WO-2015056349-A1 (Year: 2024).*

(Continued)

*Primary Examiner* — Geoffrey S Evans
(74) *Attorney, Agent, or Firm* — Saliwanchik, Lloyd & Eisenschenk

(57) ABSTRACT

A jig for processing a via hole according to an embodiment is an auxiliary member having a plate shape disposed between a processing plate in which a suction portion is disposed at a lower portion and a workpiece, wherein the auxiliary member includes a plurality of first suction holes for sucking and supporting the workpiece by suction air provided through the suction portion, and each of the plurality of first suction holes includes a first suction hole portion extending in a first direction, and a second hole portion extending in a second direction different from the first direction, wherein the first direction is perpendicular to the second direction.

18 Claims, 25 Drawing Sheets

(51) Int. Cl.
  *B23K 26/382* (2014.01)
  *H05K 3/00* (2006.01)

(56) References Cited

U.S. PATENT DOCUMENTS

| | | | |
|---|---|---|---|
| 9,209,591 | B2 | 12/2015 | Takeda et al. |
| 9,511,379 | B2 | 12/2016 | Hiyama |
| 9,688,563 | B2 | 6/2017 | Ono et al. |
| 9,735,099 | B2 | 8/2017 | Kobayashi et al. |
| 2002/0190741 | A1* | 12/2002 | Maruyama .......... H01L 21/6838 324/750.14 |
| 2009/0066447 | A1 | 3/2009 | Dutta |
| 2017/0137314 | A1 | 5/2017 | Ono et al. |
| 2019/0329357 | A1* | 10/2019 | Avdokhin .......... B23K 26/0608 |

FOREIGN PATENT DOCUMENTS

| | | |
|---|---|---|
| JP | 2013-4926 A | 1/2013 |
| JP | 2017-88467 A | 5/2017 |
| KR | 10-2003-0001560 A | 1/2003 |
| KR | 10-0734691 B1 | 7/2007 |
| KR | 10-2012-0058957 A | 6/2012 |
| KR | 10-2014-0019639 A | 2/2014 |
| KR | 10-2014-0134220 A | 11/2014 |
| KR | 10-2014-0138492 A | 12/2014 |
| KR | 10-1519314 B1 | 5/2015 |
| KR | 10-2015-0094781 A | 8/2015 |
| KR | 10-2015-0102390 A | 9/2015 |
| KR | 10-2017-0012228 A | 2/2017 |
| KR | 10-2017-0018449 A | 2/2017 |
| WO | WO-03028954 A2 * | 4/2003 .......... B25B 11/005 |
| WO | WO-2015056349 A1 * | 4/2015 .......... B23K 26/382 |

OTHER PUBLICATIONS

International Search Report dated Mar. 31, 2020 in International Application No. PCT/KR2019/015538.
Office Action dated Feb. 7, 2023 in Korean Application No. 10-2018-0144644.
Office Action dated Dec. 7, 2022 in Korean Application No. 10-2018-0144670.
Office Action dated Feb. 7, 2023 in Korean Application No. 10-2018-0144698.

* cited by examiner (A)

(B)

(A)

(B)

(C)

(A)

(B)

(A)

(B)

major axis ----- minor axis ——— major axis ----- minor axis ———

FIG. 20A
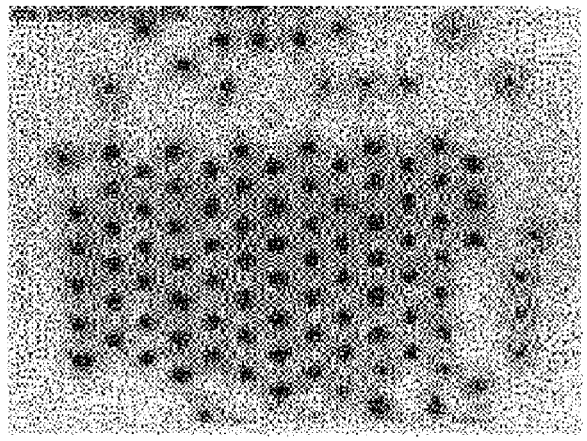
(A)
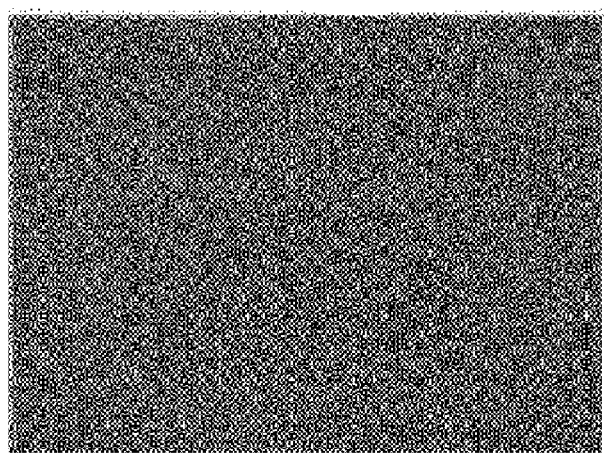
(B)
FIG. 20B

FIG. 20C
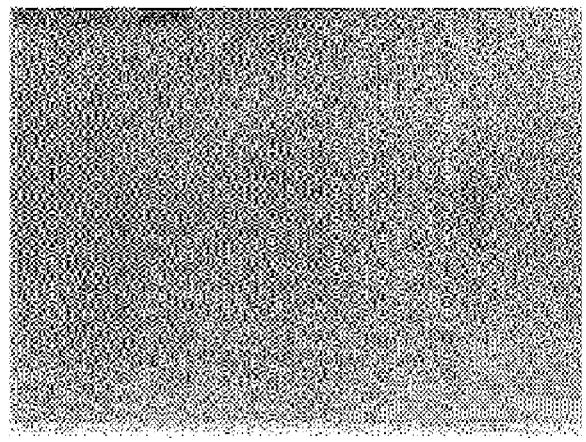
(C)
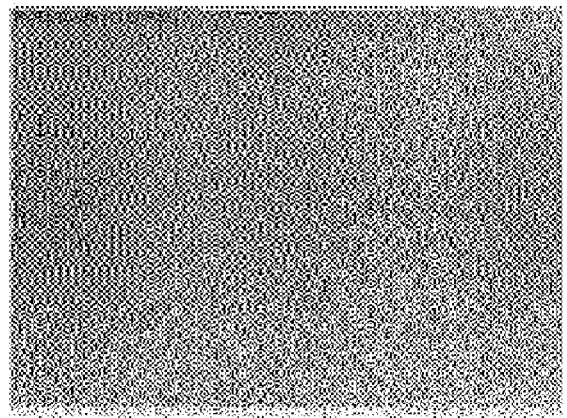
(D)
FIG. 20D

FIG. 20E
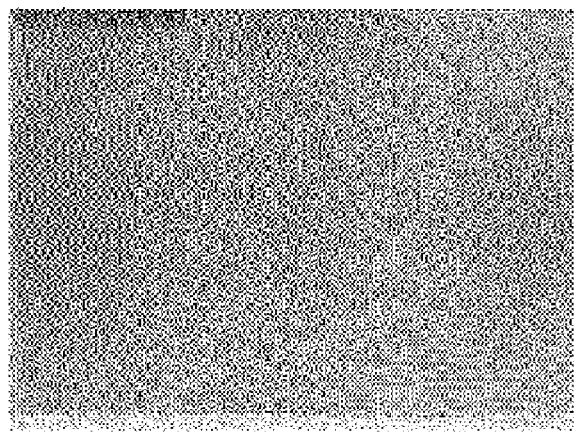
(E)
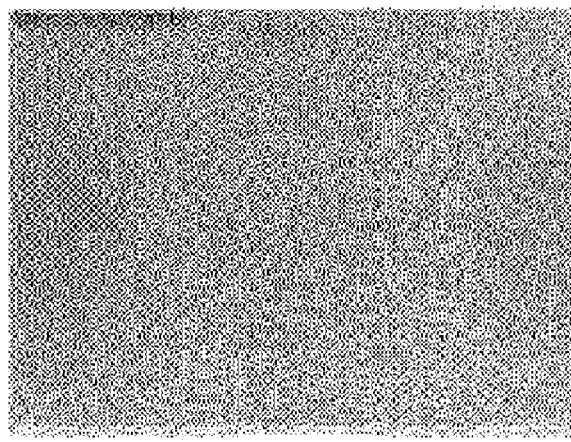
(F)
FIG. 20F

FIG. 22A
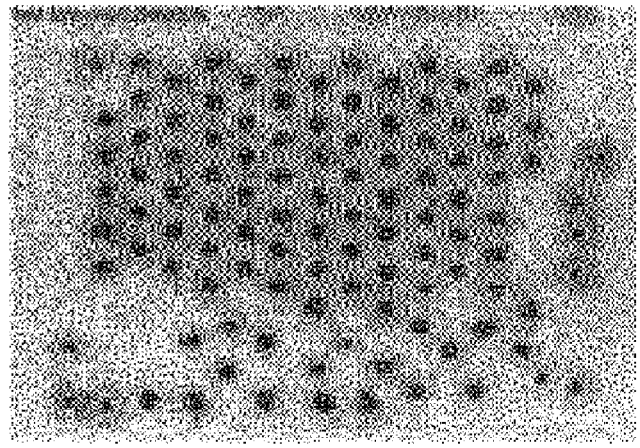
(A)
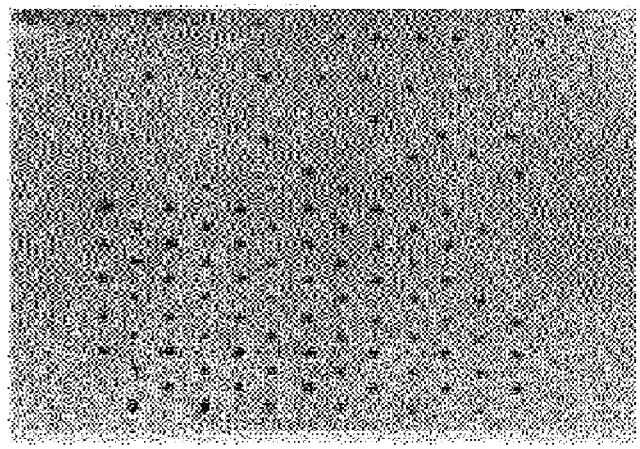
(B)
FIG. 22B

FIG. 22C
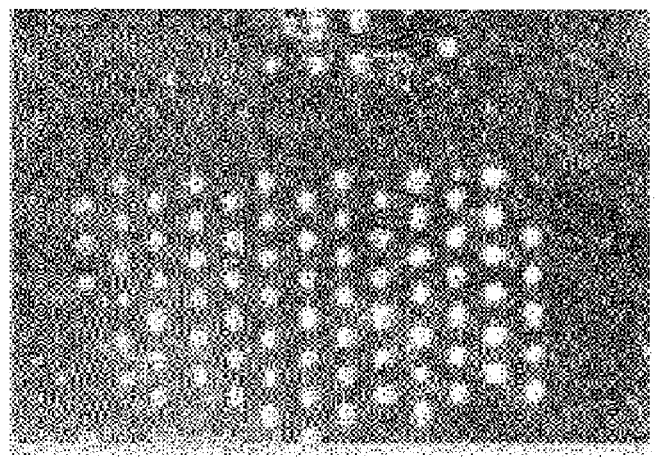
(C)
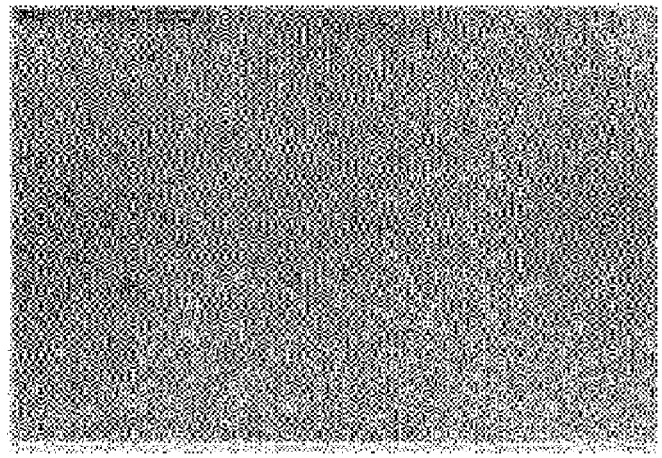
(D)
FIG. 22D (E)

JIG FOR VIA-HOLE PROCESSING, VIA-HOLE PROCESSING DEVICE, AND VIA-HOLE PROCESSING METHOD USING SAME

CROSS-REFERENCE TO RELATED APPLICATIONS

This application is the U.S. national stage application of International Patent Application No. PCT/KR2019/015538, filed Nov. 14, 2019, which claims the benefit under 35 U.S.C. § 119 of Korean Patent Application Nos. 10-2018-0144644, filed Nov. 21, 2018; 10-2018-0144670, filed Nov. 21, 2018; and 10-2018-0144698, filed Nov. 21, 2018; the disclosures of each of which are incorporated herein by reference in their entirety.

TECHNICAL FIELD

An embodiment relates to a printed circuit board, and specifically, the embodiment relates a jig for processing a via hole capable of minimizing the occurrence of wrinkles when forming a via hole, a printed circuit board, and a method of manufacturing the same.

BACKGROUND ART

In recent years, according to tendency of electronic products to become light, thin, short and small, components of electronic products are also required to be highly integrated, ultra-thin, and highly functional. Accordingly, in order to reflect the above requirements on a printed circuit board on which highly integrated, ultra-thin, and highly functional parts are mounted, micro via hole technology for diversifying circuit design of the board is being introduced.

In the case of processing a via hole of the printed circuit board, a mechanical processing using a mechanical fine drill or exposure method was mostly used, but, recently, a via hole processing apparatus using laser light has been used.

The via-hole processing apparatus using laser light is superior to the mechanical processing using a fine drill in that it can cope with a processing speed and the miniaturization of a hole diameter.

In the via hole processing apparatus using the laser light, the laser light using a CO2 laser or a high-frequency solid state laser is generally used, which has a low cost and maintenance cost of a laser oscillator.

The via hole processing for the laser light is performed on a jig in which a plurality of first suction holes for fixing a workpiece disposed on a processing plate are formed.

The jig is disposed at a position corresponding to a plurality of second suction holes formed in the processing plate, and accordingly air is sucked through the first suction hole to fix a position of the workpiece disposed on the jig.

Meanwhile, as the number of via holes has recently increased, the maximum temperature generated on the surface of the processed plate may rise to 700° C. during via hole processing using a CO2 laser. In addition, as the surface temperature of the processing plate increases, expansion and contraction are repeated in the workpiece fixed on the processing plate, resulting in surface wrinkles, resulting in a problem of lowering the flatness.

At this time, the flatness of the workpiece is related to the positional accuracy of the via hole. That is, when the flatness of the workpiece is deteriorated, the position of the via hole or the shape of the via hole is distorted, thereby reducing the reliability of the printed circuit board.

DISCLOSURE

Technical Problem

In the embodiment, a jig for processing a via hole, a via hole processing apparatus, a printed circuit board, and a method of manufacturing the same, which can improve reliability, are provided.

In addition, in the embodiment, a jig, a via hole processing apparatus, a printed circuit board, and a method of manufacturing the same for processing a via hole capable of increasing the fixing force of a workpiece mounted on a processing plate are provided.

In addition, in the embodiment, a jig, a via hole processing apparatus, a printed circuit board, and a method of manufacturing the via hole processing for improving the positional accuracy and shape uniformity of the via hole formed in the workpiece, are provided.

In addition, in the embodiment, a jig, a via hole processing apparatus, a printed circuit board, and a method of manufacturing the same for machining a via hole capable of maintaining the flatness of the workpiece by maximizing the suction area of the workpiece are provided.

In addition, in the embodiment, a via hole processing method capable of minimizing damage to a processing plate of a via hole processing apparatus are provided.

The technical problems to be achieved in the proposed embodiment are not limited to the technical problems mentioned above, and other technical problems not mentioned may be clearly understood by those of ordinary skill in the art to which the proposed embodiment belongs from the following description.

Technical Solution

A jig for processing a via hole according to an embodiment is an auxiliary member having a plate shape disposed between a processing plate in which a suction portion is disposed at a lower portion and a workpiece, wherein the auxiliary member includes a plurality of first suction holes for sucking and supporting the workpiece by suction air provided through the suction portion, and each of the plurality of first suction holes includes a first suction hole portion extending in a first direction, and a second hole portion extending in a second direction different from the first direction, wherein the first direction is perpendicular to the second direction.

In addition, a center of the first hole portion is aligned with a center of the second hole portion in the same vertical line.

In addition, a length of the first hole portion is same as a length of the second hole portion.

In addition, the first hole portion and the second hole portion have a length in the range of 4.5 mm to 7.5 mm.

In addition, the first hole portion and the second hole portion have a length of 0.3 times to 0.5 times the pitch between the plurality of first suction holes.

In addition, the processing plate includes a plurality of second suction holes aligned with the first suction hole in a vertical line, and a center of the second suction hole is aligned with a center of the first suction hole in the same vertical line, wherein a shape of the first suction hole is different from a shape of the second suction hole.

In addition, the first hole portion and the second hole portion have a length of 1.5 to 2.5 times the diameter of the second suction hole.

In addition, the first hole portion and the second hole portion have a length of 0.3 to 0.5 times the pitch between the plurality of second suction holes.

In addition, the first hole portion and the second hole portion have a hole width of 0.8 mm to 1.0 mm.

In addition, the first hole portion and the second hole portion include an overlap region overlapping in a vertical direction, and an area of the overlap region is smaller than an area of the second suction hole.

In addition, the first hole portion includes a first sub-hole portion formed at one end of the first hole portion and concave toward the center of the first hole portion, and a second sub-hole portion formed at the other end of the first hole portion and concave toward the center direction of the first hole portion, wherein the second hole portion includes a third sub-hole portion formed at one end of the second hole portion and concave toward the center of the second hole portion, and a fourth sub-hole portion formed at the other end of the second hole portion and concave toward the center of the second hole portion.

In addition, the auxiliary member is formed of an epoxy resin or a metal material of any one of copper, aluminum and SUS.

Meanwhile, a via hole processing apparatus for processing a via hole includes a processing plate; an suction portion disposed under the processing plate; a jig disposed on the processing plate and having a plurality of first suction holes for sucking and supporting a workpiece; and a head portion disposed on the jig and irradiating laser light to a position where a via hole is formed of the workpiece, and the processing plate includes a plurality of second suction holes aligned in a vertical line with the first suction hole, and a center of the second suction hole is aligned on the same vertical line as the center of the first suction hole, a shape of the first suction hole is different from a shape of the second suction hole, and wherein each of the plurality of first suction holes includes a first hole portion extending in a first direction, and a second hole portion extending in a second direction different from the first direction, wherein the first direction is perpendicular to the second direction.

In addition, a center of the first hole portion is aligned on the same vertical line as the center of the second hole portion, a length of the first hole portion is the same as a length of the second hole portion, and each of the first hole portion and the second portion has a length in the range of 4.5 mm to 7.5 mm.

According to an embodiment, a method of processing a via hole of a substrate may include mounting a jig including a first suction hole on a processing plate; fixing a workpiece on the jig using the first suction hole; and forming a via hole in the work piece using a laser light, wherein the workpiece includes an Insulating layer and a panel including a metal layer attached to a surface of the insulating layer, and a first protective member attached under the panel and disposed between the panel and the jig, wherein the first protective member is a release film attached to a lower surface of the panel, and wherein the forming of the via hole includes forming the via hole passing the panel while not passing through the first protective member.

In addition, the first protective member has a thickness in the range of 90 μm to 240 μm.

In addition, the thickness of the first protective member is determined by a thickness of the metal layer constituting the panel.

In addition, the thickness of the first protective member is 30 times or more of the thickness of the metal layer constituting the panel.

In addition, the metal layer includes a first metal layer disposed on an upper surface of the insulating layer, and a second metal layer disposed on a lower surface of the insulating layer, and the thickness of the first protective member is at least 30 times a total thickness of the first and second metal layers.

In addition, the first protective member includes a first protective layer disposed under the panel and a second protective layer disposed under the first protective layer.

In addition, a method of processing a via hole of a substrate according to another embodiment includes: mounting a jig including a first suction hole on a processing plate; fixing a workpiece on the jig using the first suction hole; and forming a via hole in the work piece using a laser light, wherein the work piece includes an insulating layer and a panel including first and second metal layers attached to a surface of the insulating layer, and a second protective member attached under the panel and disposed between the panel and the jig, wherein the second protective member includes an adhesive film attached to a lower surface of the panel and a dummy metal layer attached under the adhesive film, and wherein the forming of the via hole includes forming the via hole passing the panel while not passing through the first protective member.

In addition, the panel includes a protective metal layer disposed on the first and second metal layers and protecting the panel, and the dummy metal layer is a protective metal layer and has a thickness of 18 μm.

In addition, the thickness of the dummy metal layer is determined by the thicknesses of the first and second metal layers.

In addition, the dummy metal layer has a thickness ranging from 3 to 8 times a total thickness of the first and second metal layers.

A printed circuit board according to the embodiment includes an Insulating layer; and a via disposed in the via hole formed while passing the insulating layer, wherein an upper surface of the via has a first width, and a lower surface of the via has a second width smaller than the first width, and wherein the first width is less than 2 times the second width.

In addition, the first width is greater than 1.5 times the second width.

In addition, the first width is between 1.5 and 1.7 times the second width.

In addition, the printed circuit board includes an upper land disposed on the upper surface of the via; and a lower land disposed on the lower surface of the via, wherein a center of the upper land and a center of the lower land are aligned on the same vertical line.

In addition, a center of the via is aligned on the same vertical line as the center of the upper land and the center of the lower land.

Meanwhile, a method of manufacturing a printed circuit board includes mounting a jig including a first suction hole on a processing plate; fixing a workpiece on the jig using the first suction hole; and forming a via hole in the workpiece using a laser light, wherein the jig is a metal plate made of any one of copper, aluminum, and SUS or an alloy thereof, and wherein an upper surface of the via hole has a first width, and a lower surface of the via hole has a second width smaller than the first width, and the first width is between 1.5 and 1.7 times the second width.

In addition, a center of the upper surface of the via hole is aligned on the same vertical line as a center of the lower surface of the via hole.

In addition, the first suction hole includes a first hole portion extending in a first direction, and a second hole portion extending in a second direction different from the first direction, and wherein the first direction is perpendicular to the second direction, and a center of the first hole portion is aligned on the same vertical line as a center of the second hole portion.

In addition, the first hole portion and the second hole portion have a length ranging from 4.5 mm to 7.5 mm.

In addition, the processing plate includes a plurality of second suction holes aligned on a vertical line with the first suction hole, and a center of the second suction hole is aligned on the same vertical line as the center of the first suction hole, wherein a shape of the first suction hole is different from a shape of the second suction hole.

In addition, the first hole portion and the second hole portion include an overlap region overlapping in a vertical direction, and an area of the overlap region is smaller than an area of the second suction hole.

Effects of the Invention

According to the present embodiment, by changing a shape of the suction hole formed in the jig, the suction region of the workpiece can be maximized without loss of suction power, and thus flatness of the workpiece can be maintained.

In addition, according to the present embodiment, it is possible to improve the flatness of the workpiece disposed on the processing plate, and accordingly, the positional accuracy and shape uniformity of the via hole formed in the workpiece.

In addition, according to the present embodiment, it is possible to reduce the distribution of the size of the via hole compared to the prior art, and accordingly, the processing capability of the via hole may be improved, thereby improving reliability.

In addition, according to the embodiment, the size ratio of the upper width and the lower width of the via hole may be reduced. Accordingly, it is possible to solve the via short-circuit problem that occurs when the debris of the workpiece remains at a lower part of the via hole during the via hole processing.

In addition, according to an embodiment, when a via hole is formed in a workpiece, the protective member attached under the workpiece is non-passed, thereby minimizing damage to the processing plate or jig provided in the via hole processing apparatus.

DESCRIPTION OF DRAWINGS

FIGS. 20A to 20F are views showing the reliability of the protective member of FIG. 19.

FIGS. 22A to 22E are views showing the reliability of the protective member of FIG. 21.

BEST MODE

Figure 1:
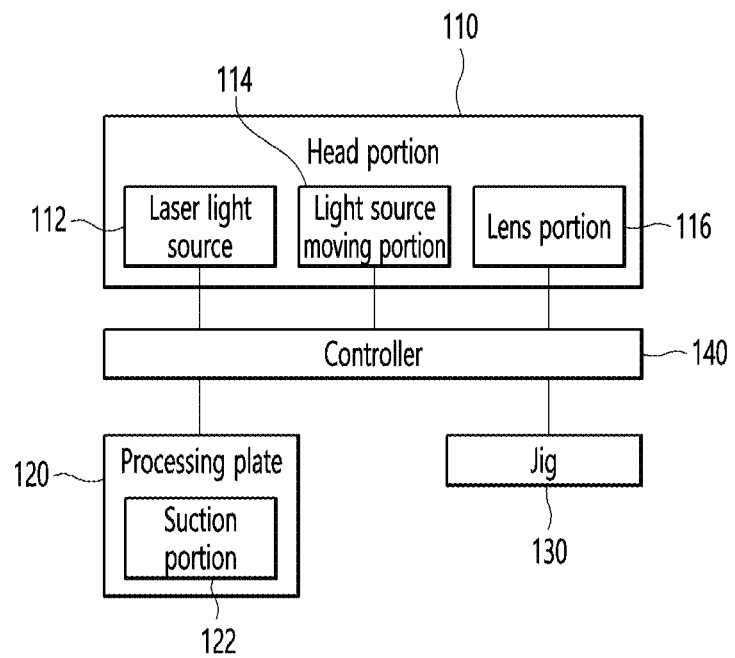
FIG. 1 is a block diagram showing a via hole processing apparatus according to an embodiment.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Figure 2:
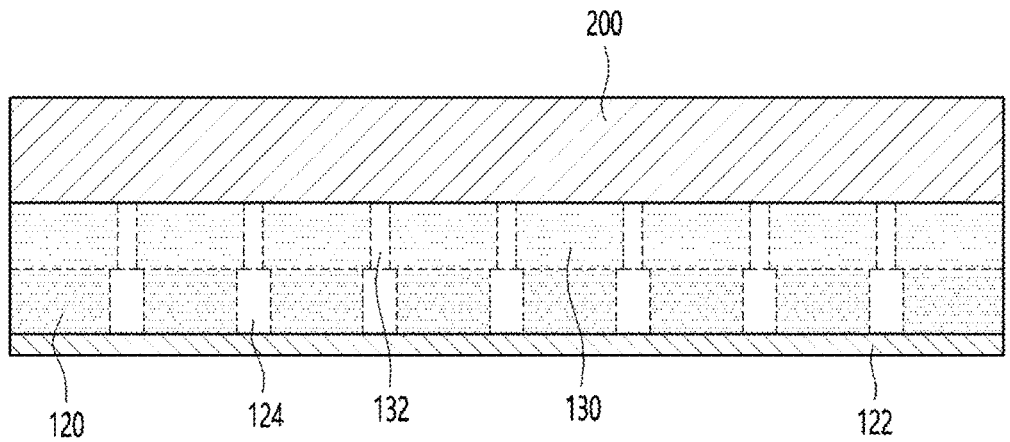
FIG. 2 is a cross-sectional view showing a configuration of a via hole processing apparatus of FIG. 1 in detail.

FIG. 1 is a block diagram showing a via hole processing apparatus according to an embodiment in a block diagram, and FIG. 2 is a cross-sectional view showing a partial configuration of the via hole processing apparatus of FIG. 1 in detail.

A via hole processing apparatus according to an embodiment will be described with reference to FIGS. 1 and 2.

FIGS. 1 and 2, the via hole processing apparatus may include a head portion 110, a processing plate 120, a jig 130, and a controller 140.

The head portion 110 may generate a laser light on the workpiece 200 (for example, a panel) disposed on the processing plate 120 to form a via hole VH on the workpiece 200.

To this end, the head portion 110 may include a laser light source 112, a light source moving portion 114 and a lens portion 116.

The laser light source 112 emits a laser light. The laser light source 112 may also be referred to as a laser oscillator. The laser light source 112 may emit heating light according to a CO2 continuous wave laser. In addition, the laser light source 112 may include a laser drill such as an excimer or a YAG laser (Nd: YAG). In this case, a wavelength of light generated from the laser light source 112 may be, for example, approximately 0.8 μm to 11 μm, but is not limited thereto.

In addition, the laser light source 112 may emit processing light for performing a via hole processing operation in the via hole formation region. For example, the laser light source 112 may emit a processing light 125 according to a pulse laser. Here, the processed light may have a pulse width ranging from millisecond to femtosecond. Here, the via hole (VH) refers to a hole through a substrate, and may mean a hole for connecting a conductor and a conductor by inserting a component, and a hole for connecting and connecting other layers without inserting a component.

The laser light source 112 may include only one light source that generates processing light for processing the via hole VH. Alternatively, the laser light source 112 may include a plurality of light sources respectively generating processing light for processing the via hole VH and heating light for heating the workpiece 200. In addition, the laser light source 112 may include a plurality of light sources that generate a plurality of processing lights for simultaneously processing the via holes VH in a plurality of regions.

Preferably, the laser light source 112 may be a CO2 laser light source with a wavelength of 9.5 μm.

The light source moving portion 114 may move the position of the laser light generated from the laser light source 112. Preferably, the light source moving portion 114 may change the direction of laser light generated from the laser light source 112. The light source moving portion 114 may include one or two or more reflectors. In addition, the light source moving portion 114 may be configured as a scanner including a galvanometer having two axes of the X-axis and the Y-axis, or three-axis galvano mirrors of the X-axis, Y-axis and Z-axis. Here, although not shown in the drawing, a separate branch (not shown) may be disposed between the laser light source 112 and the light source moving portion 114, and based on this, a two-axis via hole processing apparatus having two optical systems may be constructed.

The lens portion 116 focuses the laser light whose position and direction are switched by the light source moving portion 114. To this end, the lens portion 116 may include a lens into which laser light whose irradiation direction is changed by the operation of a galvanometer constituting the light source moving portion 114 is incident. For example, the lens portion 116 may be formed of an fθ lens, but is not limited thereto.

That is, the laser light source 112, the light source moving portion 114, and the lens portion 116 constitute the head portion 110. In addition, accordingly, laser light for processing the via hole VH may be irradiated onto the workpiece 200. In this case, the head portion 110 may be configured as one, but is not limited thereto. For example, the head portion 110 may be composed of two or more, and thus productivity may be increased.

A workpiece 200 is disposed on a processing plate 120. For example, a panel on which the via hole VH will be formed may be disposed on the processing plate 120. The panel constituting the workpiece 200 may be a copper clad laminate (CCL) including an insulating layer in which a copper foil layer is stacked, but is not limited thereto. For example, the panel constituting the workpiece 200 may be composed of a flexible copper clad laminate (FCCL).

A plurality of second suction holes 124 are formed in the processing plate 120. The processing plate 120 may include a plurality of second suction holes spaced apart from each other in a horizontal axis direction and a vertical axis direction.

In addition, the jig 130 may be coupled to the processing plate 120. The jig 130 may be detachable from the processing plate 120. For example, a bonding space (not shown) of the jig 130 may be provided on the processing plate 120, and the jig 130 may be detachably coupled to the bonding space. At this time, a plurality of first suction holes 132 are formed in the jig 130

In this case, when the jig 130 is mounted on the processing plate 120, the plurality of first suction holes 132 may overlap the plurality of second suction holes 124 in a vertical direction. That is, the number of first suction holes 132 formed in the jig 130 may correspond to the number of second suction holes 124 formed in the processing plate 120. In addition, in the first suction hole 132, the second suction holes 124 may be 1:1 aligned. For example, the jig 130 may be disposed on the processing plate 120 such that the first suction hole 132 is 1:1 aligned with the second suction hole 124 in the vertical direction.

The second suction hole 124 may have a circular shape. In addition, the first suction hole 132 may have various shapes according to embodiments. The shape and standard of the first suction hole 132 will be described in more detail below.

Meanwhile, the processing plate 120 may include a suction portion 122. The suction portion 122 may be disposed in the processing plate 120. Preferably, the suction portion 122 may be disposed under the processing plate 120. More preferably, the suction portion 122 may be disposed under the plurality of second suction holes 124 formed in the processing plate 120.

The suction portion 122 may suck air through the second suction hole 124. Preferably, the suction portion 122 sucks air through the second suction hole 124 and the first suction hole 132 to adsorb and fix the workpiece 200 disposed on the jig 130. To this end, the suction portion 122 may include a suction fan (not shown), but is not limited thereto.

The controller 140 may control the overall operation of the via hole processing apparatus. That is, the controller 140 may control driving by controlling each component constituting the via hole processing apparatus.

To this end, the controller 140 may include a separate program for controlling each component or a storage medium (not shown) for storing data generated while driving each component. The storage medium constituting the controller 140 may store processing condition information including the location or shape of the via hole VH to be formed in the workpiece 200.

The controller 140 may control at least one of the light source moving portion 114, the lens portion 116, and the processing plate 120 using the stored processing condition information. For example, the controller 140 may control the movement of at least one of the light source moving portion 114, the lens portion 116, and the processing plate 120 in an upward direction, a downward direction, a left direction, etc. using the processing condition information. In addition, the controller 140 may adjust the output of the laser light source 112 according to the size (depth or width, etc.) of the via hole VH or a material of the workpiece 200.

Referring to FIG. 2, a processing plate 120 is disposed on the suction portion 122. In addition, the jig 130 is disposed on the processing plate 120. In addition, the workpiece 200 is disposed on the jig 130. At this time, the jig 130 may be formed of epoxy. Alternatively, the jig 130 may be formed of a metal material such as copper (Cu), aluminum (Al), and SUS, but is not limited thereto.

Looking at the operation of the via hole processing apparatus as described above, the jig 130 may be coupled to the processing plate 120 in which the suction portion 122 is disposed below. At this time, a plurality of first suction holes 132 are formed in the jig 130. In addition, a plurality of second suction holes 124 are formed in the processing plate 120.

In addition, the jig 130 may be disposed on the processing plate 120 such that the plurality of first suction holes 132 and the respective second suction holes 124 are aligned in a vertical direction. That is, each of the plurality of second suction holes 124 may overlap each of the plurality of first suction holes 132 in the vertical direction. More preferably, a center of each of the plurality of second suction holes 124 may be aligned in a vertical direction with a center of the plurality of first suction holes 132.

In addition, the workpiece 200 may be disposed on the jig 130. At this time, the suction portion 122 sucks air through the first suction hole 132 and the second suction hole 124, and accordingly, the workpiece 200 may be adsorbed and fixed on the jig 130 by the adsorption force caused by the air intake.

Figure 3:
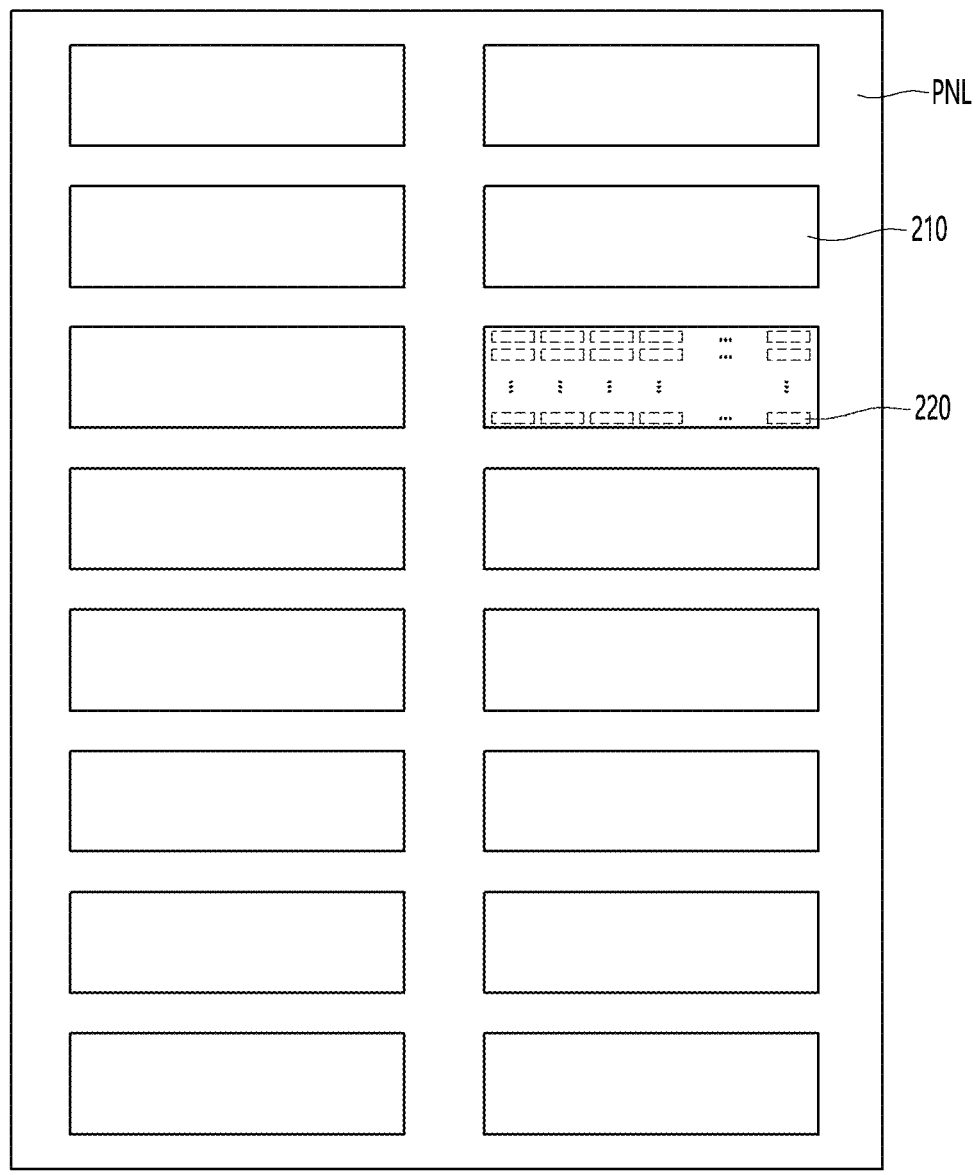
FIG. 3 is a view showing an example of a workpiece according to the embodiment.

FIG. 3 is a view showing an example of a workpiece according to the embodiment.

Referring to FIG. 3, the workpiece 200 may be a panel PNL in the form of a copper clad laminate (CCL). In this case, the width of the panel PNL in the horizontal direction may be 415 to 430 mm. In addition, the width of the panel PNL in the vertical direction may be 510 to 550 mm. Here, the width in the horizontal direction of the panel PNL may be the width in a minor axis direction, and the width in the vertical direction may be the width in a major axis direction.

In this case, the panel PNL may be divided into a plurality of strips 210. The plurality of strips 210 may be spaced apart from each other in a horizontal direction and a vertical direction within the panel PNL. For example, one panel PNL may be divided into 16 strips 210. That is, one panel PNL may be divided into two regions in a horizontal direction and eight regions in a vertical direction, and each of the divided regions may constitute the strip 210.

In addition, each strip 210 may be divided into a plurality of units 220. For example, one strip 210 may be divided into 1,275 units 220. In this case, each unit 220 may have a width of 3 mm in the horizontal direction and a width of 2 mm in the vertical direction. Meanwhile, each of the units 220 may constitute one printed circuit board. In other words, one panel PNL may be divided into 16 strips 210 and 20,400 units 220.

Meanwhile, a plurality of via holes VH having a predetermined size may be formed in one unit 220. For example, a plurality of via holes VH having an upper width of 80 μm and a lower width of 60 μm may be formed in one unit 220.

At this time, about 150 via holes VH are formed in one unit 220. Accordingly, one panel PNL may include 20,400 units 220 in which about 150 via holes VH are formed. In conclusion, more than 3 million via holes VH are formed in one panel PNL.

In addition, in recent years, as circuit wiring becomes more complex and highly integrated, the number of via holes VH is gradually increasing. Accordingly, at least 3 million or more via holes VH are formed in one panel PNL, and accordingly, it is important to maintain the flatness of the panel PNL until the formation of the 3 million or more via holes VH is completed. That is, during laser processing for forming a via hole, heat is applied to the panel PNL, and accordingly, the surface temperature of the panel PNL rises to a maximum of 700° C. At this time, the panel PNL repeatedly expands and contracts, and accordingly, wrinkles occur on the surface of the panel PNL. In addition, the position or shape of the via hole VH is changed during laser processing in a situation in which the generated wrinkles occur. Therefore, it should be possible to maintain the flatness of the panel PNL by minimizing problems such as wrinkles occurring in the panel PNL.

Figure 4:
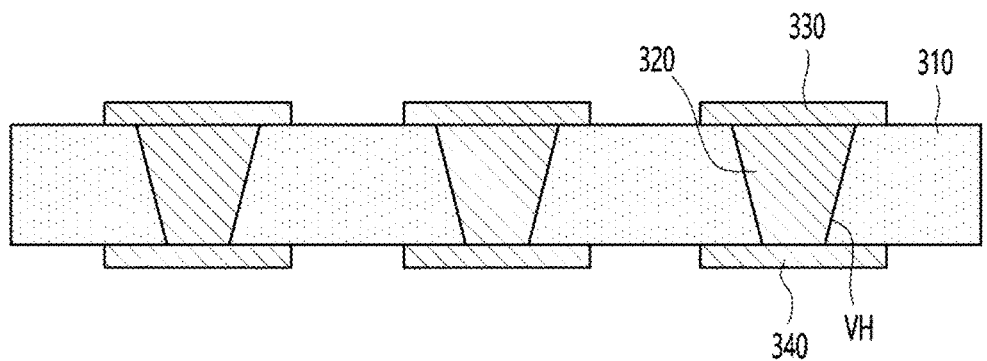
FIG. 4 is a view showing the structure of a printed circuit board according to an embodiment.

FIG. 4 is a view showing the structure of a printed circuit board according to an embodiment.

Referring to FIG. 4, the printed circuit board may be one unit 220 divided by the panel PNL.

The printed circuit board may include an insulating layer 310 and a via 320 disposed in a via hole VH passing the insulating layer 310, an upper land 330 disposed on the via 320, and a lower land 340 disposed under the via 320.

In this case, the printed circuit board may be a multilayer laminated board. In addition, when the printed circuit board is a multilayer laminated substrate, FIG. 4 may show one specific layer among the multilayered laminated substrates. Preferably, FIG. 4 may show a central layer disposed at a center of the multilayered substrate.

The insulating layer 310, the upper land 330, and the lower land 340 may be part of a copper clad laminate constituting the panel PNL. Preferably, the insulating layer 310 may be an insulating member constituting a copper clad laminate. In addition, some of the upper land 330 and the lower land 340 may be copper foil layers stacked on and under the insulating member, respectively.

The insulating layer 310 is a substrate on which an electric circuit capable of changing wiring is formed, and the insulating layer may include all of the upper land 330, the lower land 340, and a printed circuit made of an insulating material capable of forming a circuit pattern (not shown) formed as described above, a wiring board, and an insulating substrate.

The insulating layer 310 may be rigid or flexible. For example, the insulating layer 310 may include glass or plastic. In detail, the insulating layer 310 may include chemically strengthened/semi-tempered glass such as soda lime glass or aluminosilicate glass, or reinforced or flexible plastics such as polyimide (PI), polyethylene terephthalate (PET), propylene glycol (PPG) polycarbonate (PC), or sapphire.

In addition, the insulating layer 310 may include a photoisotropic film. For example, the insulating layer 310 may include Cyclic Olefin Copolymer (COC), Cyclic Olefin Polymer (COP), photoisotropic polycarbonate (PC), or photoisotropic polymethylmethacrylate (PMMA).

In addition, the insulating layer 310 may be bent while having a partially curved surface. That is, the insulating layer 310 may be bent while partially having a flat surface and partially having a curved surface. In detail, the insulating layer 310 may be bent while having a curved end or a surface including a random curvature, and may be bent or curved.

In addition, the insulating layer 310 may be a flexible substrate having flexible characteristics. In addition, the insulating layer 310 may be a curved or bent substrate. In this case, the insulating layer 310 represents an electrical wiring connecting circuit components based on a circuit design as a wiring diagram, and an electrical conductor may be reproduced on an insulating material. In addition, the insulating layer 310 may form a wiring for mounting electrical components and connecting them in a circuit, and mechanically fix components other than the electrical connection function of the components.

An upper land 330 and a lower land 340 may be disposed on the surface of the insulating layer 310. In this case, the upper land 330 and the lower land 340 may be formed together with a circuit pattern (or wiring, not shown) disposed on the surface of the insulating layer 310 to transmit an electrical signal. The upper land 330 and the lower land 340 may be formed of a metal material having high electrical conductivity. To this end, the upper land 330 and the lower land 340 may be formed of at least one metal material selected from among gold (Au), silver (Ag), platinum (Pt), titanium (Ti), tin (Sn), copper (Cu), and zinc (Zn). In addition, the upper land 330 and the lower land 340 may be formed of a paste or solder paste containing one metal material of gold (Au), silver (Ag), platinum (Pt), titanium (Ti), tin (Sn), copper (Cu), and zinc (Zn) having excellent bonding strength. Preferably, the upper land 330 and the lower land 340 may be formed of copper (Cu) having high electrical conductivity and a relatively inexpensive price.

The upper land 330 and the lower land 340 may be formed by an additive process, a subtractive process, a Modified Semi Additive Process (MSAP), and a semi-additive process (SAP), which is a typical printed circuit board manufacturing process, and detailed descriptions thereof will be omitted herein.

Meanwhile, a via 320 passing the upper and lower surfaces of the insulating layer 310 is disposed in the insulating layer 310. The via 320 may be formed by filling the inside of the via hole VH passing the upper and lower surfaces of the insulating layer 310 with a metal material.

As described above, the via hole VH may be formed by a laser processing method. That is, the via hole VH may be formed by a via hole processing apparatus using a CO2 laser method.

In addition, the via 320 may form by filling of any one metal material selected from copper (Cu), silver (Ag), tin (Sn), gold (Au), nickel (Ni), and palladium (Pd) in the via 320. At this time, the filling of the metallic material may use any one of electroless plating, electroplating, screen printing, sputtering, evaporation, ink jetting, and dispensing, or a combination thereof.

Figure 5A:
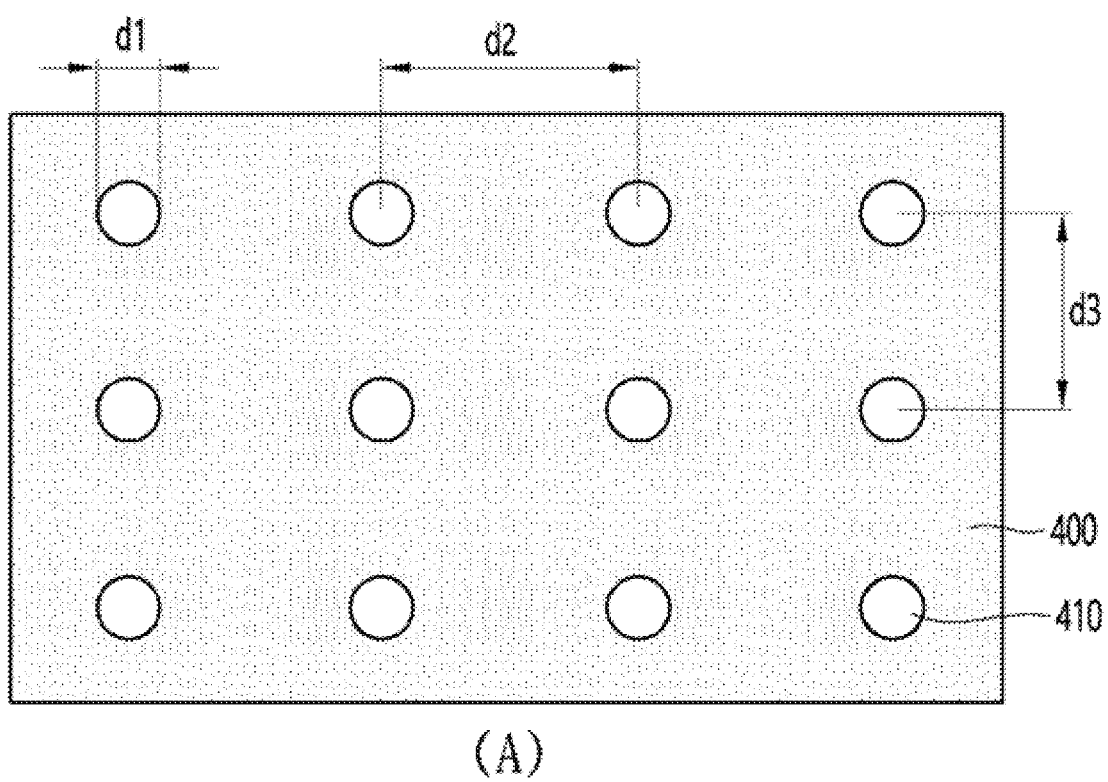
FIGS. 5A and 5B are plan views showing a processing plate and a jig according to a comparative example.
Figure 5B:
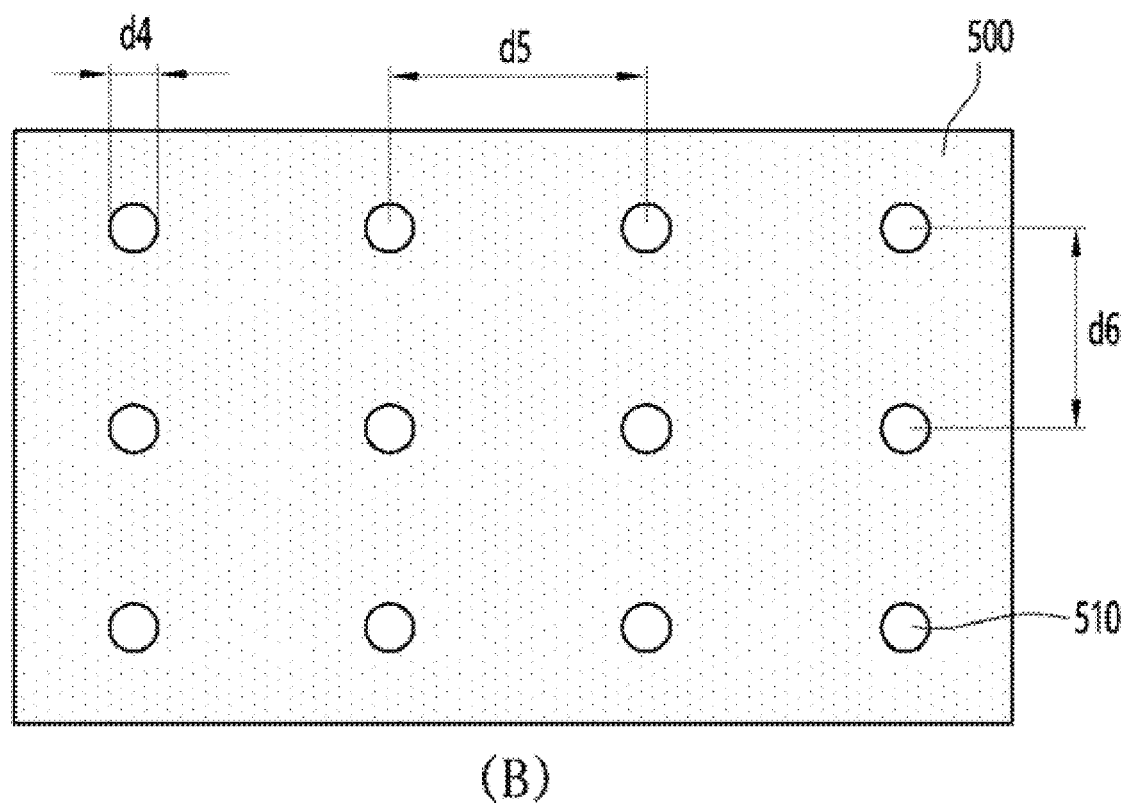
Figure 6:
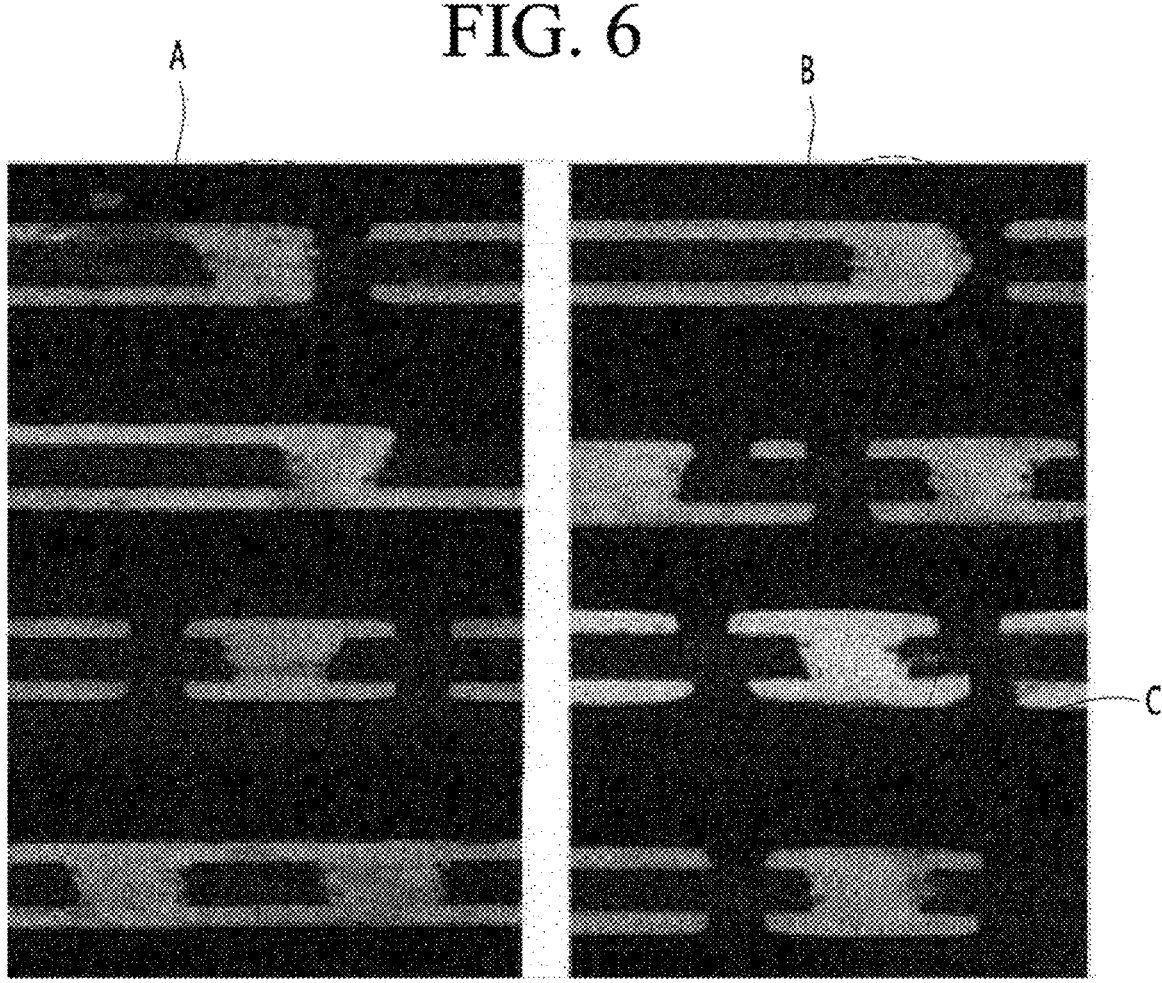
FIGS. 6 and 7 are views showing examples of defective via holes according to a comparative example.
Figure 7A:
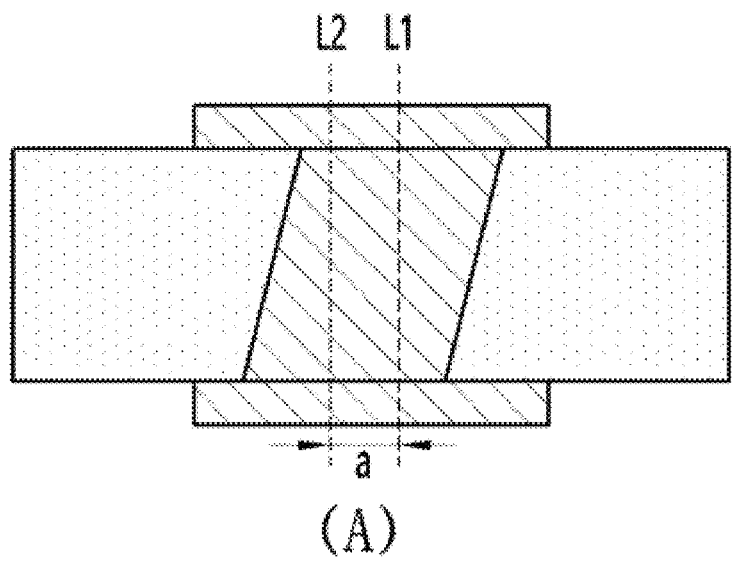
Figure 7B:
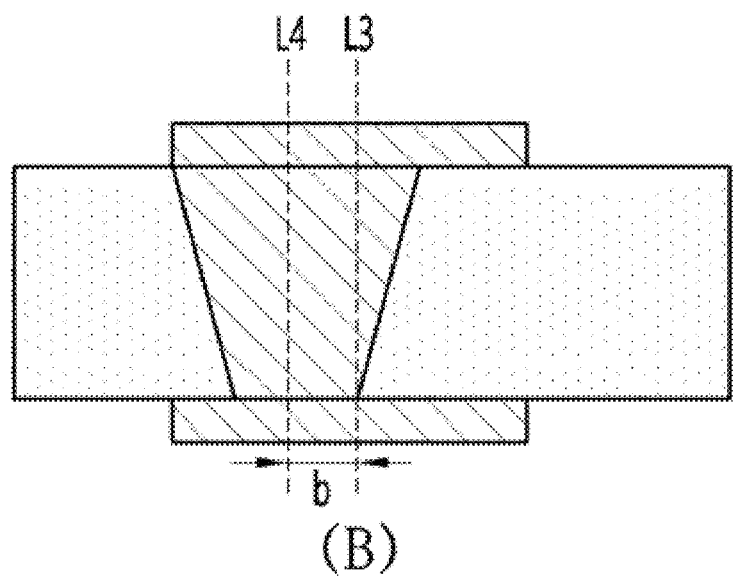
Figure 7C:
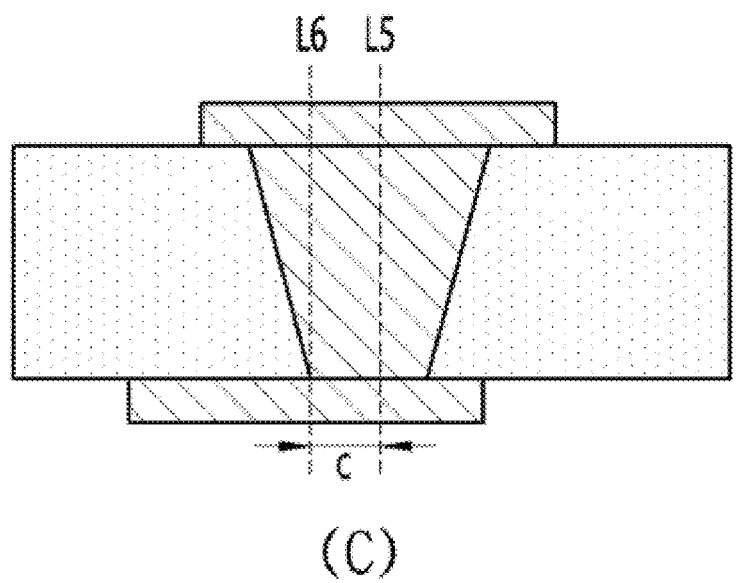
Figure 8:
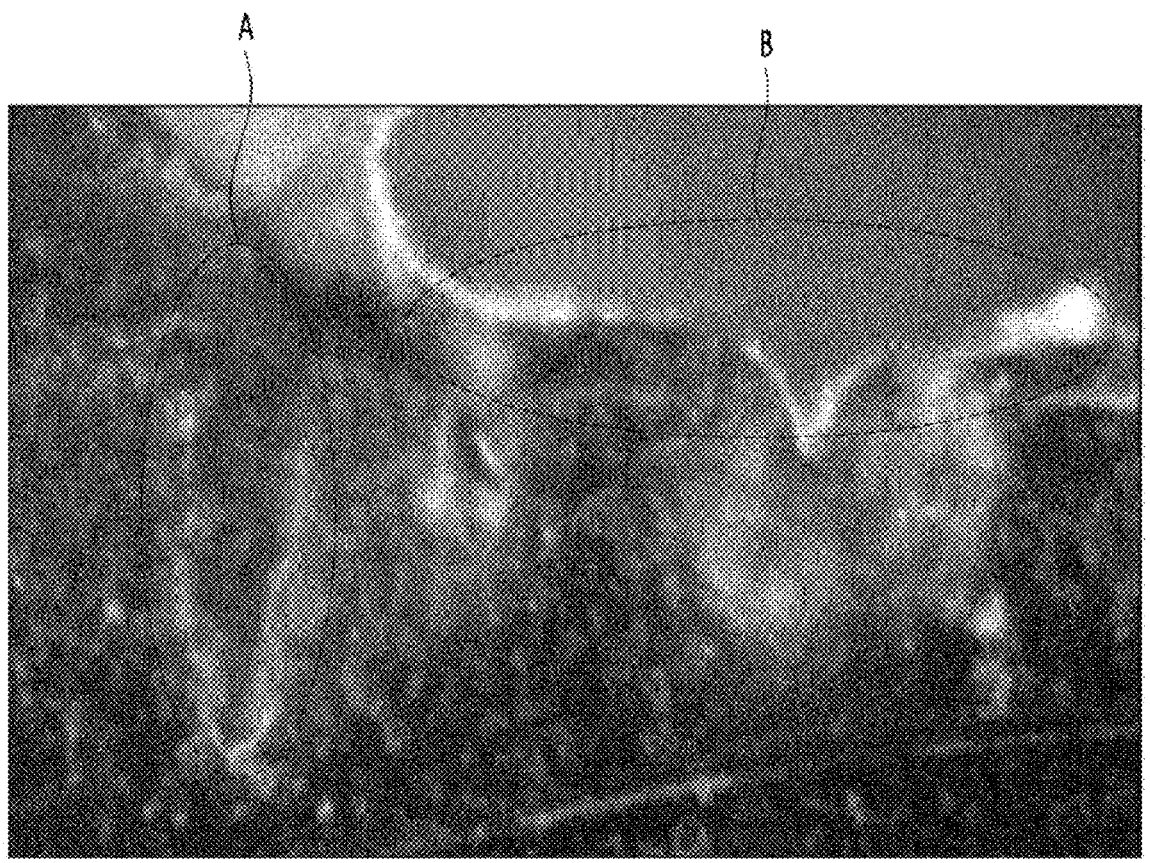
FIG. 8 is a view showing an example of a failure of a jig according to a comparative example.

FIGS. 5A and 5B are plan views showing a machining plate and a jig according to a comparative example, FIGS. 6 and 7 are views showing a defective example of a via hole according to the comparative example, and FIG. 8 is a view showing a defective example of a jig according to the comparative example. Hereinafter, problems of the comparative example will be described with reference to FIGS. 5A to 8.

Referring to FIG. 5A, a plurality of second suction holes 410 are formed in the processing plate 400 according to the comparative example. At this time, the plurality of second suction holes 410 have a circular shape. That is, the second suction hole 410 has a circular shape having a first diameter d1.

In addition, the plurality of second suction holes 410 are disposed to be spaced apart by a first distance d2 in the horizontal axis direction. In addition, the plurality of second suction holes 410 are disposed to be spaced apart by a second distance d3 in the vertical axis direction.

At this time, the first diameter d1 of the second suction hole 410 is 3 mm. In addition, the first distance d2 of the second suction hole 410 in the horizontal axis direction is 15 mm. In addition, the second distance d3 of the second suction hole 410 in the vertical axis direction is 15 mm. That is, in the processing plate 400 of the comparative example, the second suction holes 410 having a diameter of 3 mm are disposed spaced apart by 15 mm in the horizontal axis direction and the vertical axis direction, respectively. Meanwhile, the second suction hole 410 is formed by being fixed to the processing plate 400 and cannot be arbitrarily changed in size, position, and number.

Referring to FIG. 5B, a plurality of first suction holes 510 are formed in the jig 500 according to the comparative example. At this time, the plurality of first suction holes 510 have a circular shape. That is, the first suction hole 510 has a circular shape having a second diameter d4. At this time, the jig 500 according to the comparative example is an epoxy jig. In other words, the jig 500 according to the comparative example is formed of an insulating material.

In addition, the plurality of first suction holes 510 are disposed to be spaced apart by a third distance d5 in the horizontal axis direction. In addition, the plurality of first suction holes 510 are disposed to be spaced apart by a fourth distance d6 in the vertical axis direction.

At this time, the second diameter d4 of the first suction hole 510 is 1.5 mm. In addition, the third distance d5 of the first suction hole 510 in the horizontal axis direction is 15 mm. In addition, the fourth distance d6 of the first suction hole 510 in the vertical axis direction is 15 mm. That is, in the jig 500 of the comparative example, the first suction holes 510 having a diameter of 1.5 mm are disposed spaced apart by 15 mm in the horizontal axis direction and the vertical axis direction, respectively.

Here, the first to fourth distances d2, d3, d5, and d6 refer to a distance (also referred to as a pitch) between centers of neighboring holes.

At this time, in the comparative example, the jig 500 is an epoxy jig. Accordingly, in the comparative example, as the epoxy jig repeats thermal expansion and thermal contraction, it is difficult to maintain the flatness of the workpiece disposed on the jig. Accordingly, in the comparative example, a defect occurs in the via hole formed in the workpiece.

FIGS. 6 and 7, in the printed circuit board according to the comparative example, a via hole deformation defect, a via hole alignment defect, and a land alignment defect occur.

That is, referring to FIG. 7A, in the printed circuit board according to the comparative example, a via hole deformation defect occurs due to insufficient suction power or a suction region of the jig 500. That is, centers of the upper and lower portions of the via hole VH should coincide with each other with the via hole VH as the center. When the center of the upper and lower centers of the via hole VH coincide, it means that the shape of the via hole VH has an ideal trapezoidal shape. However, according to the comparative example, the center L1 of the upper portion and the center L2 of the lower portion of the via hole VH are shifted by an interval of 'a' rather than on the same line. That is, the shape of the via hole VH according to the comparative example has a parallelogram shape rather than a trapezoid shape due to laser eccentricity.

In addition, referring to FIG. 7B, in the printed circuit board according to the comparative example, a via hole alignment failure occurs due to insufficient suction power or a suction region of the jig 500. That is, the center of the via hole VH should be aligned with the centers of the upper and lower lands on the same line. When the center of the via hole VH and the center of the upper and lower lands are aligned, it means that the via hole is accurately positioned at the center of the upper and lower lands. However, according to the comparative example, the center L4 of the via hole VH is shifted by the interval 'b' from the center L3 of the lower land and the upper land. That is, the via hole VH according to the comparative example is formed to be skewed in the outer portion of the upper land and the lower land, not in the center.

In addition, referring to FIG. 7C, in the printed circuit board according to the comparative example, land alignment failure occurs due to insufficient suction force or suction region of the jig 500. That is, the center of the upper land and the center of the lower land must be aligned on the same line. However, according to the comparative example, a separation distance exists between the center L5 of the upper land and the center of the lower land L6 by the 'c' interval.

In addition, the above defects cause the following problems.

The occurrence of a shift between the via hole (VH) and the land, such as a via hole deformation defect or a via hole defect, decreases reliability due to the occurrence of noise in the electrical signal due to the adjacent pattern, or due to the lengthening of the path of the electrical signal. In the case of a via hole for heat dissipation that is not an electric circuit or an electric circuit, component performance is degraded due to a decrease in heat dissipation efficiency. In addition, the occurrence of a shift between the land and the land decreases inductance as the overlap area decreases when the overlapping position in the vertical direction is different, and accordingly, the efficiency of the capacitance is low, and the transmission efficiency is reduced.

In addition, referring to FIG. 8, in the comparative example, when the jig 500 is used a certain number of times or more, there is a problem that a cavity of 40 μm to 80 μm is generated in the area A. In addition, in the comparative example, there is a problem in that debris such as carbonization (organic matter) and metal materials (Cu, etc.) accumulate in the region B.

Accordingly, in the embodiment, the material of the jig is changed from an existing epoxy to a metallic material. Furthermore, by changing the shape of the suction hole formed in the jig, it is possible to maximize the suction area while minimizing the loss of suction power due to an increase in the area of the suction hole.

Figure 9A:
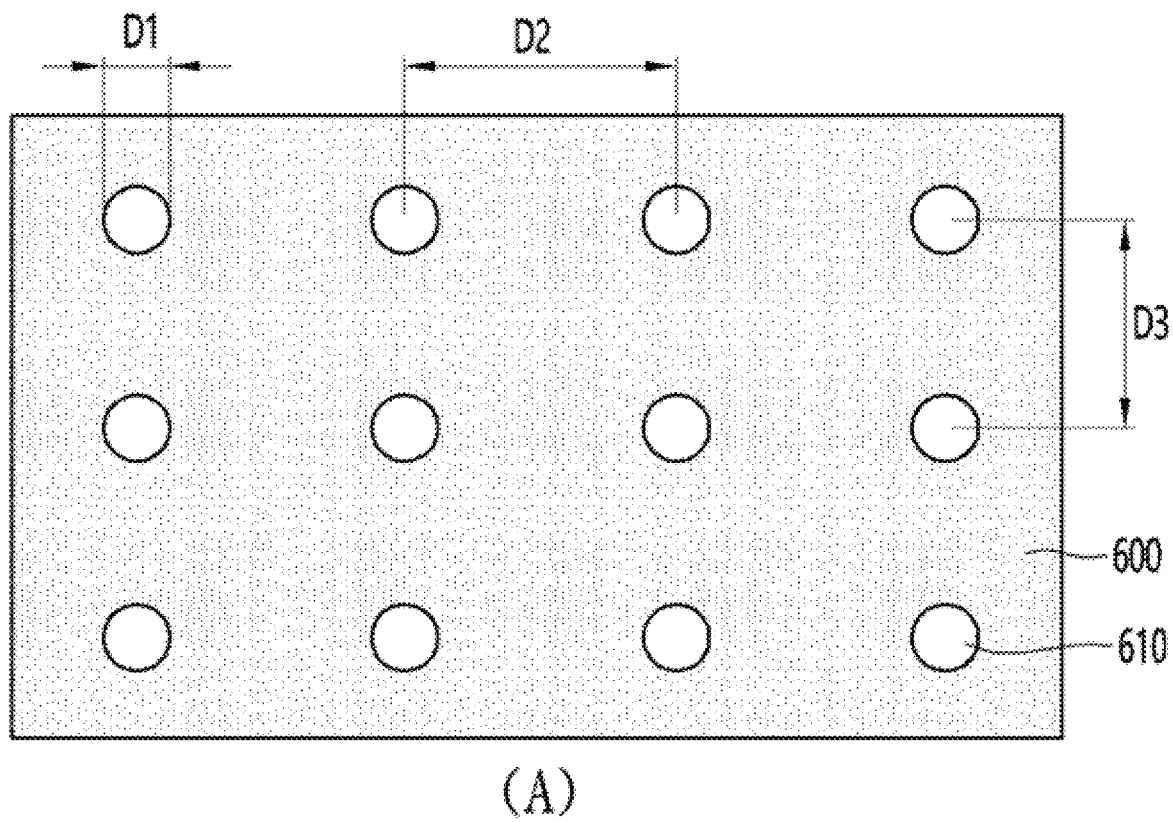
FIG. 9 is a view showing a processing plate and a jig according to an embodiment.
Figure 9B:
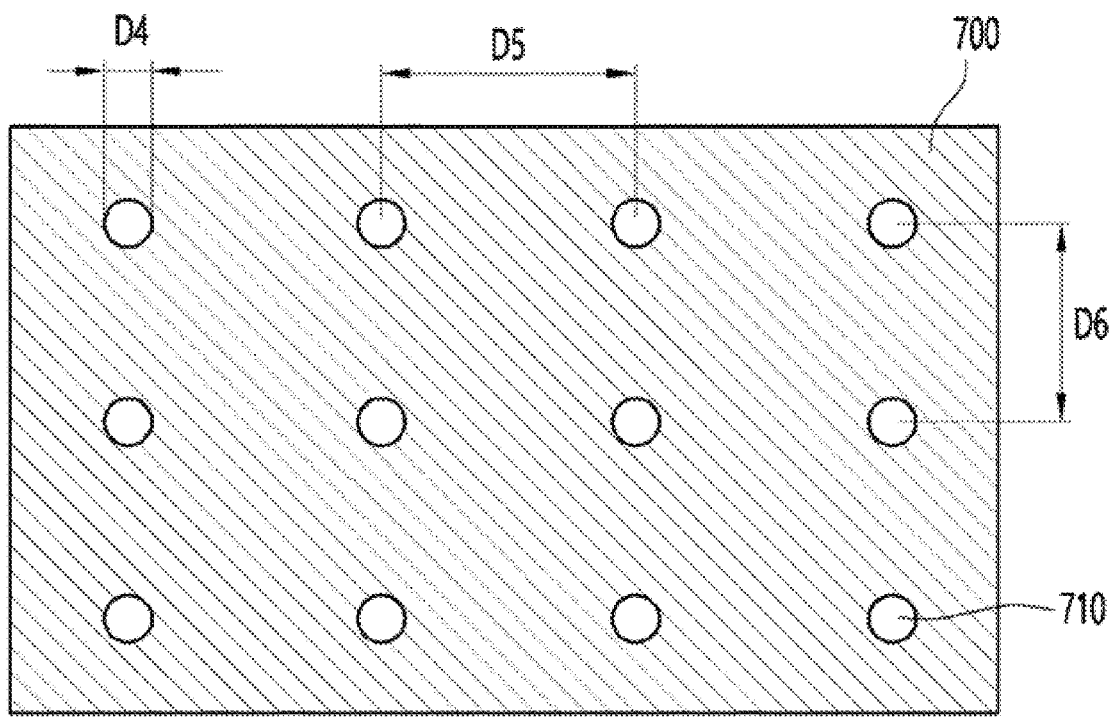

FIGS. 9A and 9B are views showing a processing plate and a jig according to an embodiment.

Referring to FIG. 9A, a plurality of second suction holes 610 are formed in the processing plate 600 according to the embodiment. In this case, the plurality of second suction holes 610 may have a circular shape. That is, the second suction hole 610 may have a circular shape having a first diameter D1.

In addition, the plurality of second suction holes 610 are disposed to be spaced apart by a first distance D2 in the horizontal axis direction. In addition, the plurality of second suction holes 610 are disposed to be spaced apart by a second distance D3 in the vertical axis direction.

In this case, the first diameter D1 of the second suction hole 610 may be 3 mm. In addition, the first distance D2 of the second suction hole 610 in the horizontal axis direction may be 15 mm. In addition, the second distance D3 of the second suction hole 610 in the vertical axis direction may be 15 mm. That is, in the processing plate 600 according to the embodiment, a plurality of second suction holes 610 having a diameter of 3 mm are disposed to be spaced apart by 15 mm from each other in the horizontal axis direction and the vertical axis direction. Meanwhile, the second suction hole 610 is formed by being fixed to the processing plate 600 and cannot be arbitrarily changed in size, position, and number.

Referring to FIG. 9B, a plurality of first suction holes 710 are formed in the jig 700 according to the embodiment. In this case, the plurality of first suction holes 710 may have a circular shape. That is, the first suction hole 710 has a circular shape having a third diameter D4. At this time, the jig 700 according to the embodiment is a metal plate formed of a metal material. Preferably, the jig 700 may be formed of at least one metal material of copper (Cu), aluminum (Al), and SUS, or an alloy thereof.

In addition, the plurality of first suction holes 710 are disposed to be spaced apart by a third distance D5 in the horizontal axis direction. In addition, the plurality of first suction holes 510 are disposed to be spaced apart by a fourth distance D6 in the vertical axis direction.

In this case, the second diameter D4 of the first suction hole 710 may be 1.5 mm. That is, the first suction hole 710 may have a diameter smaller than a diameter of the second suction hole 610 while a center of the first suction hole 710 is aligned with the second suction hole 610 in a vertical direction.

In addition, the third distance D5 of the first suction hole 710 in the horizontal axis direction is 15 mm. In addition, the fourth distance D6 of the first suction hole 710 in the vertical axis direction is 15 mm. That is, in the jig 700 according to the embodiment, the first suction holes 710 having a diameter of 1.5 mm are disposed to be spaced apart by 15 mm in the horizontal axis direction and the vertical axis direction, respectively.

Here, the first to fourth distances D2, D3, D5, and D6 mean a distance (also referred to as a pitch) between centers of neighboring holes.

In this case, in an embodiment, the existing epoxy jig is changed to a metal plate formed of a metal material, and accordingly, the flatness of the workpiece can be efficiently maintained, thereby increasing the reliability of the via hole.

Figure 10A:
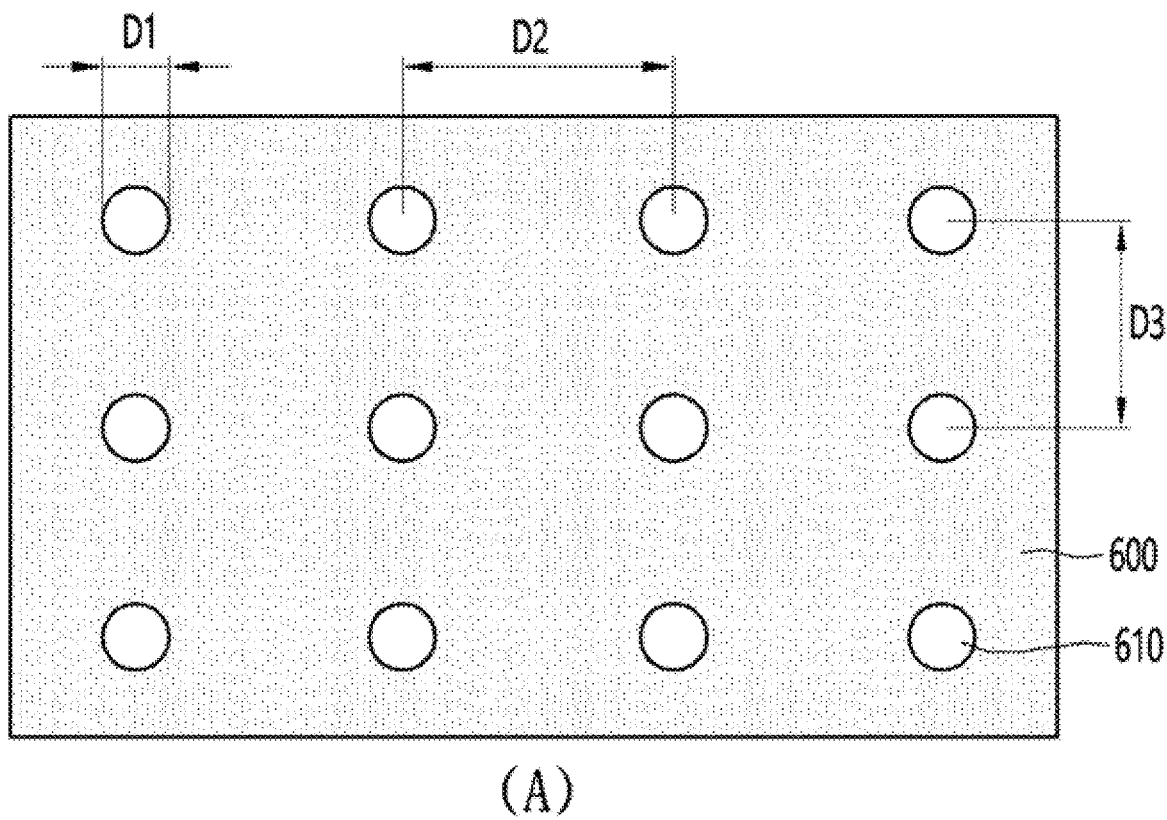
FIGS. 10A and 10B are views showing a processing plate and jig according to another embodiment.
Figure 10B:
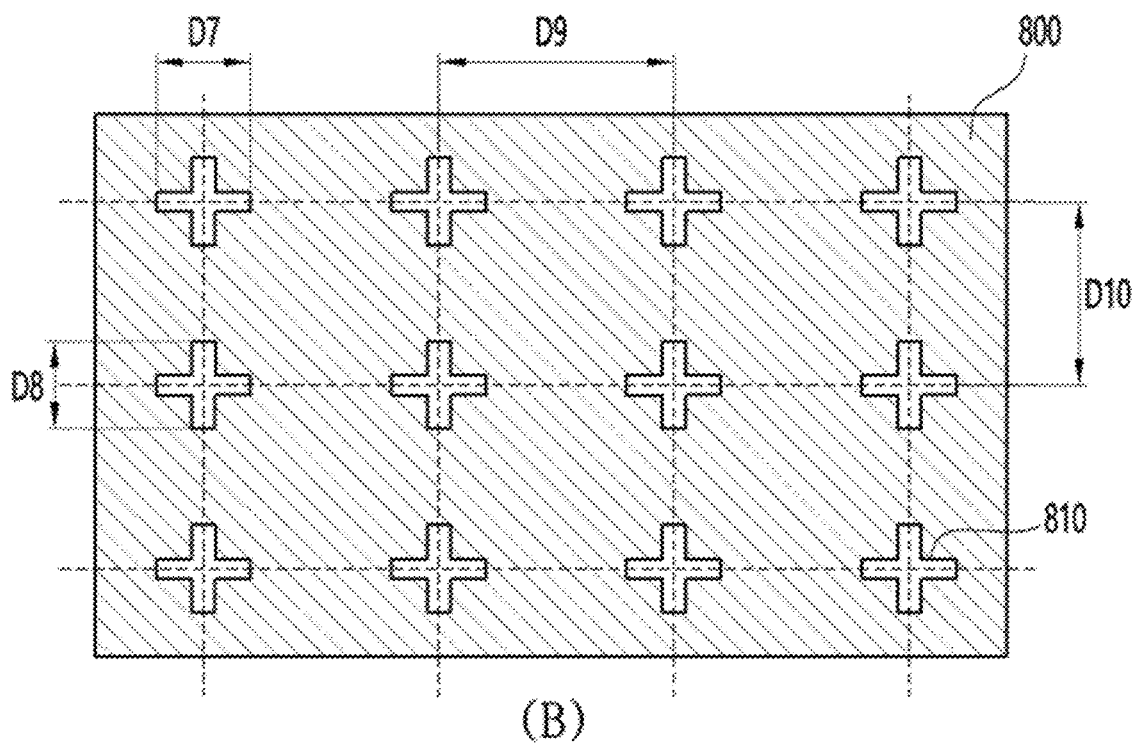

FIGS. 10A and 10B are views showing a processing plate and a jig according to another embodiment.

FIG. 10A is substantially the same as the processing plate 600 showed in FIG. 9A, and accordingly, a detailed description thereof will be omitted.

Referring to FIG. 10B, a plurality of first suction holes 810 are formed in the jig 800 according to the embodiment. In this case, the plurality of first suction holes 710 may have a shape different from that of the plurality of second suction holes 810. Preferably, the plurality of first suction holes 810 may have a '+' shape. The plurality of first suction holes 810 include a first hole portion 812 passing through the center of the hole (812, see FIG. 12) and a second hole portion (814, see FIG. 12) passing through the center of the hole and perpendicular to the first hole portion. The first hole portion 812 may extend in a horizontal direction. The first hole portion 812 may have a first length D7. The second hole portion 814 may pass through the center of the hole in the vertical direction. That is, the second hole portion 814 may extend in a vertical direction perpendicular to the first hole portion 812. The second hole portion may have a second length D8. In this case, the lengths of the first hole portion 812 and the second hole portion 814 may be the same. Preferably, the length of the first hole portion 812 may be 0.9 to 1.1 times the length of the second hole portion 814.

The lengths D7 and D8 of the first hole portion 812 and the second hole portion 814 may be 3.5 mm to 11 mm, respectively. Preferably, the lengths D7 and D8 of the first hole portion 812 and the second hole portion 814 may be 4.0 mm to 9 mm, respectively. More preferably, the lengths D7 and D8 of the first hole portion 812 and the second hole portion 814 may be 4.5 mm to 7.5 mm, respectively.

At this time, when the lengths (D7, D8) of the first hole portion 812 and the second hole portion 814 are less than 3.5 mm, air may not be sufficiently delivered (that is, air permeability by be deteriorated) from the suction portion 122. In this way, it is not possible to provide a suction force for stably sucking and supporting the panel PNL. In addition, when the lengths D7 and D8 of the first hole 812 and the second hole 814 are greater than 11 mm, suction loss may occur due to excessive ventilation due to an increase in the overall size of the first suction hole 810.

In addition, the lengths D7 and D8 of the first hole portion 812 and the second hole portion 814 may be 1.1 to 3.5 times the diameter of the second suction hole 610, respectively. Preferably, the lengths D7 and D8 of the first hole portion 812 and the second hole portion 814 may be 1.3 to 3 times the diameter of the second suction hole 610, respectively. More preferably, the lengths D7 and D8 of the first hole portion 812 and the second hole portion 814 may be 1.5 to 2.5 times the diameter of the second suction hole 610, respectively.

At this time, when the lengths (D7, D8) of the first hole portion 812 and the second hole portion 814 are less than 1.1 times the diameter of the second suction hole 610, air may not be sufficiently transmitted from the suction portion 122 (that is, air permeability may be deteriorated), and thus, a suction force for stably adsorbing and supporting the panel PNL is not provided. In addition, when the lengths D4 and D5 of the first hole 812 and the second hole 814 are larger than 3.5 times the diameter of the second suction hole 610, suction loss may occur due to excessive ventilation due to an increase in the overall size of the first suction hole 810.

In addition, the lengths D7 and D8 of the first hole portion 812 and the second hole portion 814 may be 0.2 to 0.7 times the pitch between the plurality of second suction holes 610, respectively. Preferably, the lengths D7 and D8 of the first hole portion 812 and the second hole portion 814 may be 0.25 times to 0.6 times the pitch between the plurality of second suction holes 610, respectively. More preferably, the lengths D7 and D8 of the first hole portion 812 and the second hole portion 814 may be 0.3 times to 0.5 times the pitch between the plurality of second suction holes 610, respectively.

At this time, when the lengths D7 and D8 of the first hole 812 and the second hole 814 are less than 0.2 times the pitch between the plurality of second suction holes 610, air may not be sufficiently delivered (that is, air permeability by be deteriorated) from the suction portion 122. In this way, it is not possible to provide a suction force for stably sucking and supporting the panel PNL. In addition, when the lengths (D7, D8) of the first hole portion 812 and the second hole portion 814 are larger than 0.7 times the pitch between the plurality of second suction holes 610, the overall Inhalation loss may occur due to excessive ventilation due to the increase in size.

In addition, the lengths D7 and D8 of the first hole portion 812 and the second hole portion 814 may be 0.2 to 0.7 times the pitch between the plurality of first suction holes 810, respectively. Preferably, the lengths D7 and D8 of the first hole portion 812 and the second hole portion 814 may be 0.25 times to 0.6 times the pitch between the plurality of first suction holes 810, respectively. More preferably, the lengths D7 and D8 of the first hole portion 812 and the second hole portion 814 may be 0.3 times to 0.5 times the pitch between the plurality of first suction holes 810, respectively.

In addition, the plurality of first suction holes 810 are disposed to be spaced apart by a third distance D9 in the horizontal axis direction. In addition, the plurality of first suction holes 810 are disposed to be spaced apart by a fourth distance d10 in the vertical axis direction. That is, the third distance D9 corresponding to the pitch in the horizontal direction of the plurality of first suction holes 810 may be 15 mm. In addition, the fourth distance D10 corresponding to the pitch in the vertical direction of the plurality of first suction holes 810 may also be 15 mm. That is, the pitch of the first suction hole 810 and the pitch of the second suction hole 610 may be the same. In other words, in a state in which the jig 800 is coupled to the processing plate 400, the center of the first suction hole 810 and the center of the second suction hole 610 may be aligned on the same vertical line.

In the embodiment, as described above, the shape of the first suction hole 810 is changed from the existing circular shape to the '+' shape. In this case, when the first suction hole 810 has the '+' shape, it is possible to provide the maximum suction power even with the smallest hole area, and accordingly, the flatness of the panel PNL may be kept constant.

Figure 11:
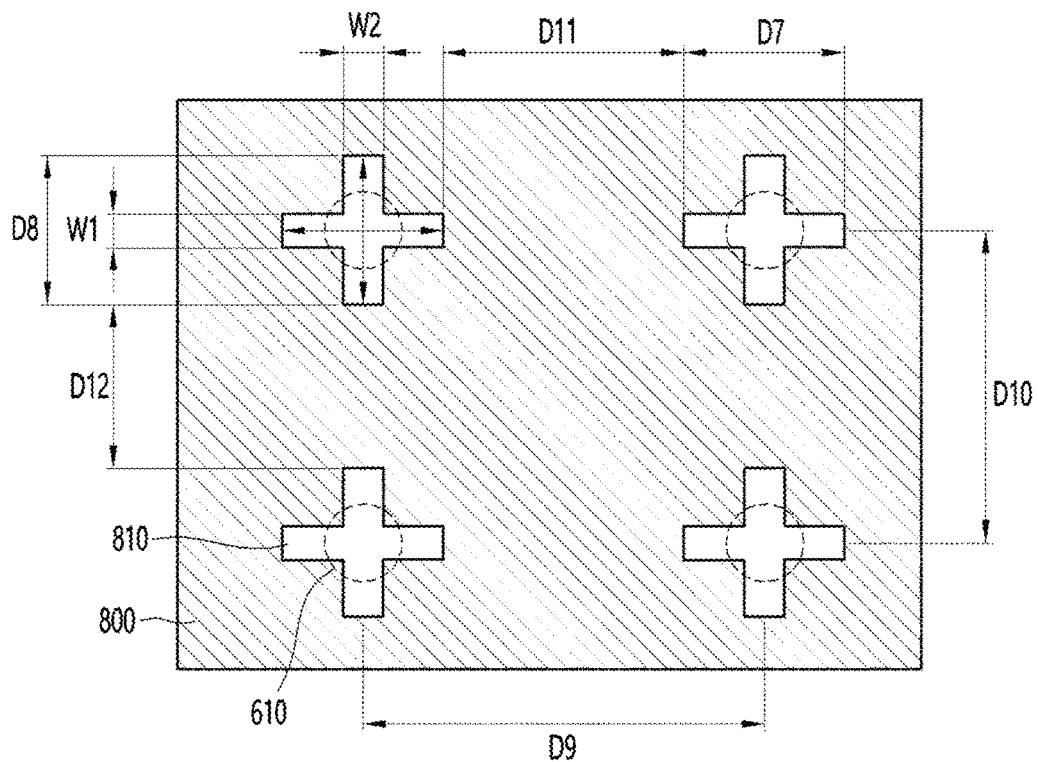
FIG. 11 is an enlarged view of a partial region of the jig shown in FIG. 10B.
Figure 12:
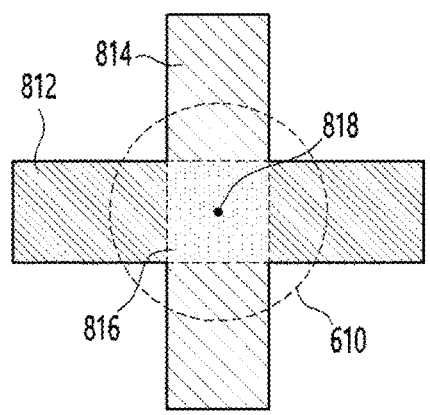
FIG. 12 is an enlarged view of the first suction hole shown in FIG. 10B.

FIG. 11 is an enlarged view of a partial area of the jig shown in FIG. 10B, and FIG. 12 is an enlarged view of the first suction hole shown in FIG. 10B.

FIGS. 11 and 12, the plurality of first suction holes 810 may have a shape different from that of the plurality of second suction holes 610. Preferably, the plurality of first suction holes 810 may have a '+' shape. The plurality of first suction holes 810 may include a first hole portion 812 passing through the center of the hole, and a second hole portion 814 passing through the center of the hole and perpendicular to the first hole portion 812. The first hole portion 812 may pass through the center of the hole in the horizontal direction. The first hole portion 812 may extend in the horizontal direction. The first hole portion 812 may have a first length D7. The second hole portion 814 may pass through the center of the hole in the vertical direction. That is, the second hole portion 814 may extend in a vertical direction perpendicular to the first hole portion 812. The second hole portion may have a second length D8. In this case, the lengths of the first hole portion 812 and the second hole portion 814 may be the same.

In this case, it is preferable that the first hole portion 812 and the second hole portion 814 cross each other at a right angle. That is, when the first hole portion 812 and the second hole portion 814 cross each other at an angle between 1° and 89° that are not at right angles, it was confirmed that adsorption was concentrated in a specific region. That is, when the first hole portion 812 and the second hole portion 814 are not at right angles, an angle between the first hole portion 812 and the second hole portion 814 may be 90 degrees or less in some areas, and larger than 90 degrees in some other areas. At this time, the suction power is concentrated in a region of 90 degrees or less. Accordingly, the suction power decreases in a region greater than 90 degrees. Accordingly, in the embodiment, the angle between the first hole portion 812 and the second hole portion 814 is made to have a right angle. Preferably, the angle between the first hole portion 812 and the second hole portion 814 has a right angle within an error range of 5 degrees.

In this case, the first hole portion 812 may have a first hole width W1. In addition, the second hole portion 814 may have a second hole width W2. In this case, the first hole width W1 and the second hole width W2 may be the same. For example, the first hole width W1 and the second hole width W2 may be 0.5 mm to 1.5 mm, respectively. Preferably, the first hole width W1 and the second hole width W2 may be 0.8 mm to 1.0 mm.

In addition, the first hole width W1 and the second hole width W2 may be 0.15 to 0.5 times the diameter of the second suction hole 610. Preferably, the first hole width W1 and the second hole width W2 may be 0.25 times to 0.35 times the diameter of the second suction hole 610.

Meanwhile, a separation distance D11 between the first hole portions 812 of the neighboring first suction holes 810 may be 7.5 mm to 10.5 mm. In addition, a separation distance D12 between the second hole portions 814 of the neighboring first suction holes 810 may be 7.5 mm to 10.5 mm.

Meanwhile, the first suction hole 810 in the embodiment includes the first hole portion 812 and the second hole portion 814. The first hole portion 812 and the second hole portion 814 overlap the second suction hole 610 in a vertical direction and include an overlap region 816 in which the centers 818 meet each other.

In addition, it is preferable that an area of the overlap region 816 is smaller than an area of the second suction hole 610. That is, when the area of the overlap region 816 is larger than the area of the second suction hole 610, a suction power loss occurs. In addition, when the area of the overlap region 816 is too small, suction power may not be normally transmitted. Accordingly, in the embodiment, the optimal overlap region 816 may determine by determining the first hole width W1 and the second hole width W2 of the first hole portion 812 and the second hole portion 814. Accordingly, the entire overlapped region 716 may overlap with the second suction hole 610 located below it in the vertical direction.

According to the present embodiment, by changing the shape of the suction hole formed in the jig, it is possible to maximize the suction region of the workpiece without loss of suction power, and thus the flatness of the workpiece may be maintained.

In addition, according to the present embodiment, it is possible to improve the flatness of the workpiece disposed on the processing plate, and accordingly, the positional accuracy and shape uniformity of the via hole formed in the workpiece.

In addition, according to the present embodiment, it is possible to reduce the distribution of the size of the via hole compared to the prior art, and accordingly, the processing capability of the via hole may be improved, thereby improving reliability.

In addition, according to the embodiment, the size ratio of the upper width and the lower width of the via hole may be reduced. Accordingly, it is possible to solve the via short-circuit problem that occurs when the debris of the workpiece remains at a lower part of the via hole during the via hole processing.

Figure 13:
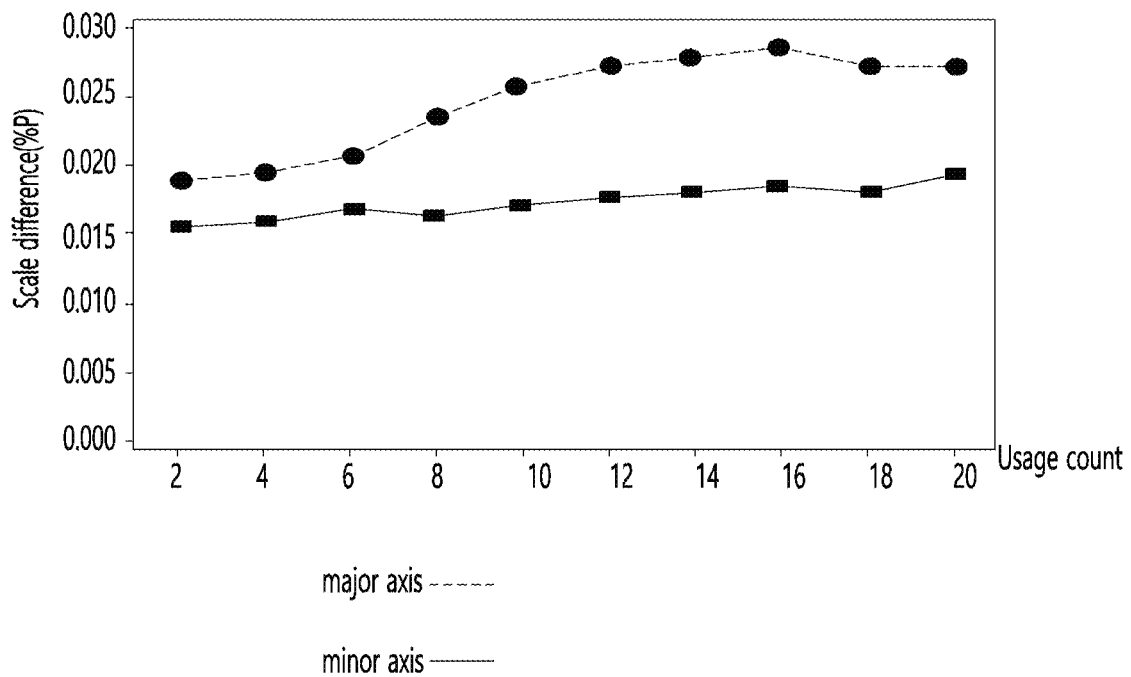
FIG. 13 is a view showing a difference in scale between a major axis and a minor axis of a panel according to a comparative example.
Figure 14:
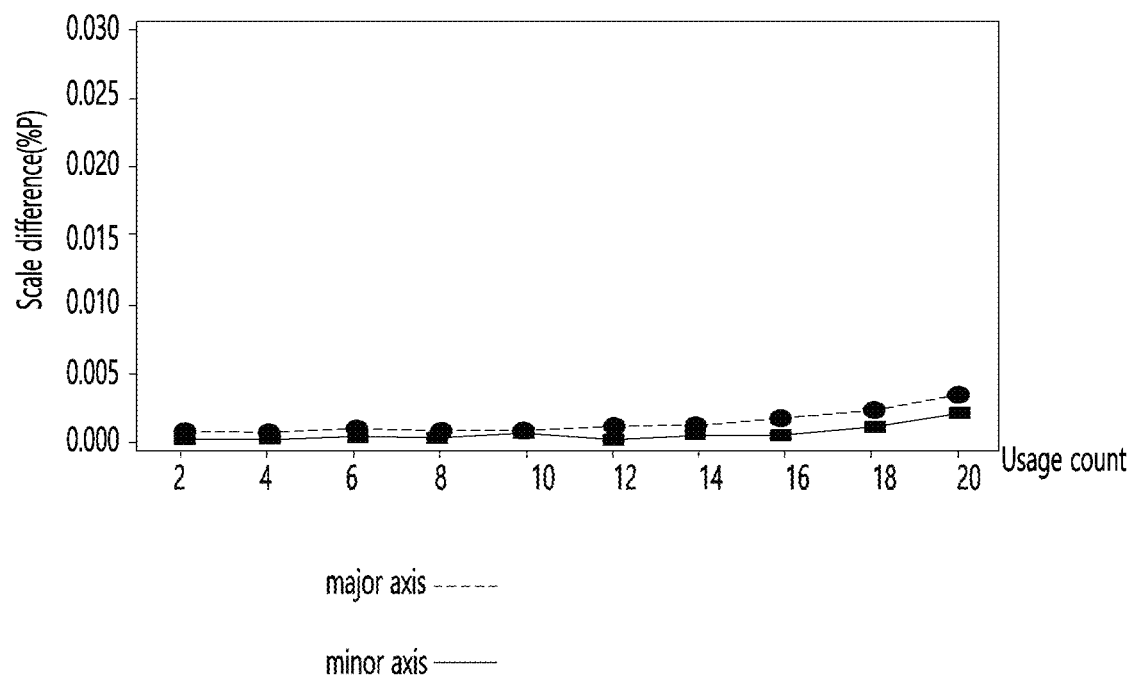
FIG. 14 is a view showing a difference in scale between a major axis and a minor axis of a panel according to an embodiment.

FIG. 13 is a view showing the difference in scale between the major axis and the minor axis of the panel according to the comparative example, and FIG. 14 is a view showing the difference between the scale between the major axis and the minor axis of the panel according to the embodiment.

Referring to FIG. 13, in the comparative example, it can be seen that the scale difference of the major axis increases and the scale difference of the minor axis increases according to the number of times the jig is used.

Here, the scale difference is a measurement of the size change of the panel (PNL), and this is to measure the length of the long axis and the short axis of the panel (PNL) placed on the jig before the via hole (VH) is processed, and then the long axis of the panel (PNL) on which the via hole (VH) has been processed. It can be confirmed by measuring the length and the length of the minor axis respectively.

Accordingly, in the comparative example, it was confirmed that the scale difference for the major axis was about 0.020% P to 0.030% P, and the scale difference for the minor axis was about 0.015% P to 0.020% P depending on the number of uses. And, accordingly, it was confirmed that the defective rate in the comparative example was 11.73%.

On the contrary, referring to FIG. 14, when using the jig 700 and 800 according to the embodiment, even if one jig is used 20 times, it was confirmed that there was no difference in scale for the major axis and the minor axis of the panel (PNL), and as a result, it was confirmed that the defective rate fell to 0.1% or less.

Figure 15:
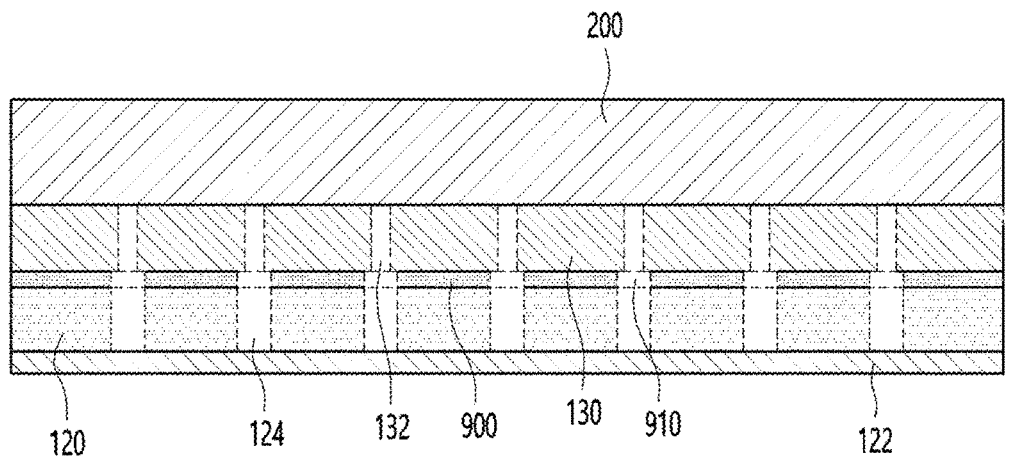
FIG. 15 is a view for explaining a jig according to another embodiment.

FIG. 15 is a view for describing a jig according to another embodiment.

Referring to FIG. 15, a protective member 900 may be additionally disposed between the jig and the processing plate. That is, unlike the comparative example, the jig in the embodiment is a metal plate formed of a metal material. Accordingly, a movement of the position of the jig may occur while the jig is disposed on the processing plate.

Accordingly, in the embodiment, the protective member 900 is disposed between the jig and the processing plate, so that the fixing force of the jig can be improved.

In this case, a third suction hole 910 is formed in the protective member 900. In this case, the third suction hole 910 may be aligned with the first suction hole and the second suction hole on a vertical line. That is, a center of the third suction hole 910 may be aligned on the same vertical line as the center of the first suction hole and the center of the second suction hole.

In addition, the third suction hole 910 may have a circular shape. Preferably, the third suction hole 910 may have the same shape as the second suction hole. Also, the third suction hole may have the same size as the second suction hole. The protective member 900 as described above may be an adhesive film. This will be described in more detail below.

Figure 16:
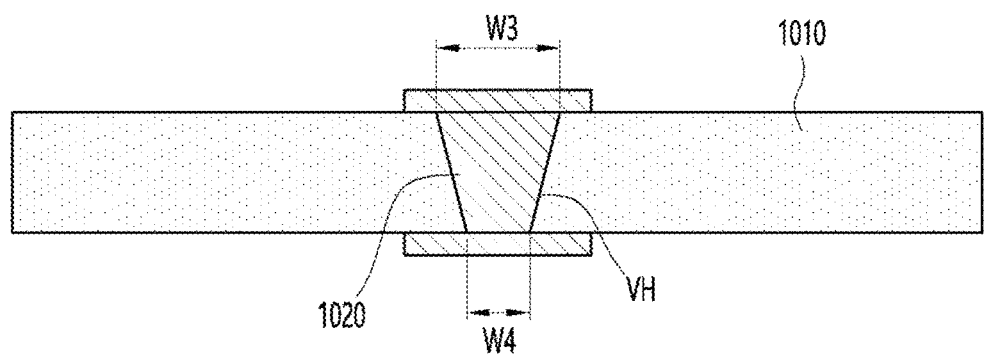
FIG. 16 is a view showing a printed circuit board according to an embodiment.

FIG. 16 is a view showing a printed circuit board according to an embodiment.

Referring to FIG. 16, the printed circuit board may be one unit 220 divided by the panel PNL.

The printed circuit board may include an insulating layer 1010 and a via 1020 disposed in a via hole VH passing the insulating layer 1010.

Vias 1020 are disposed passing the upper and lower surfaces of the insulating layer 1010 in the insulating layer 1010. The via 1020 may be formed by filling the inside of the via hole VH passing the upper and lower surfaces of the insulating layer 1010 with a metallic material.

As described above, the via hole VH may be formed by a laser processing method. That is, the via hole VH may be formed by a via hole processing apparatus using a CO2 laser method.

In addition, the via 1020 may form by filling of any one metal material selected from copper (Cu), silver (Ag), tin (Sn), gold (Au), nickel (Ni), and palladium (Pd) in the via 1020. At this time, the filling of the metallic material may use any one of electroless plating, electroplating, screen printing, sputtering, evaporation, ink jetting, and dispensing, or a combination thereof.

In this case, an upper surface of the via 1020 or the via hole VH may have a third width W3. In addition, a lower surface of the via 1020 or the via hole VH may have a fourth width W4. In this case, the third width W3 is different from the fourth width W4. Preferably, the third width W3 is larger than the fourth width W4.

Here, in the embodiment, the material of the jig is changed to a metal plate of a metal material, and furthermore, by changing the shape of the first suction hole formed in the jig, the difference between the third width W3 and the fourth width W4 may be minimized.

Figure 17:
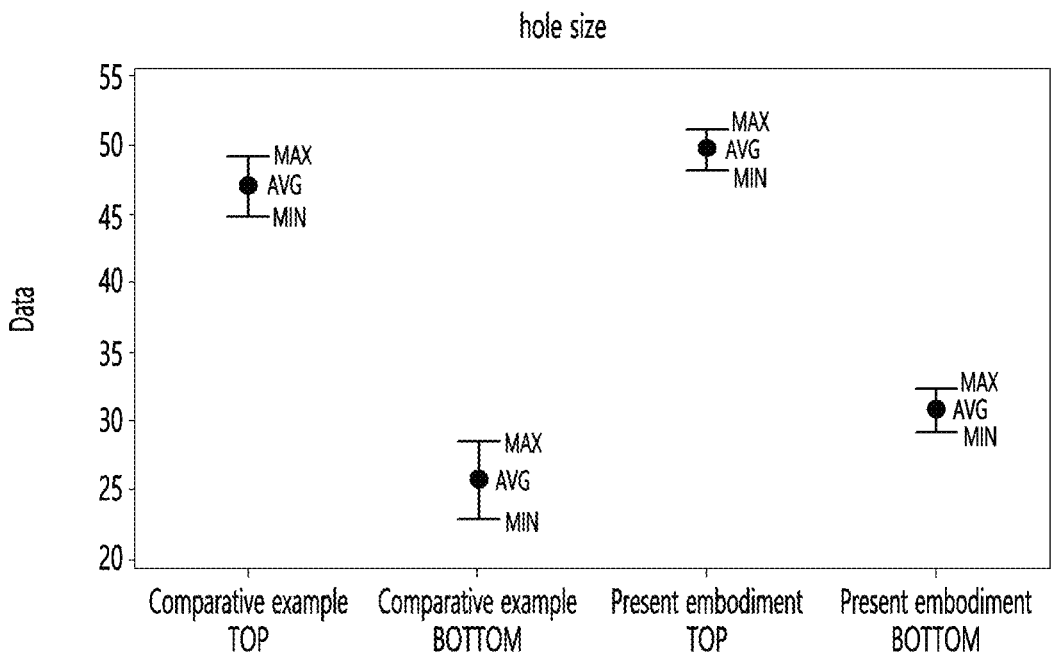
FIGS. 17 and 18 are views comparing a via hole formed according to an embodiment with a via hole of a comparative example.

FIG. 17 is a view showing a comparison between a via hole formed according to an embodiment and a via hole of a comparative example.

Here, TOP of the comparative example and TOP of the embodiment represent the width of the upper surface of the via or via hole, and BOTTOM of the comparative example and BOTTOM of the embodiment represent the width of the lower surface of the via hole.

Referring to FIG. 17, it can be seen that the distribution of the third width W3 of the via 1020 or the via hole VH is significantly smaller than that of the comparative example, and the distribution of the fourth width W4 of the hole VH is significantly smaller than that of the comparative example. In addition, in the embodiment, it was confirmed that the difference between the third width and the fourth width of the via 1020 or the via hole VH was significantly reduced compared to the comparative example.

Figure 18:
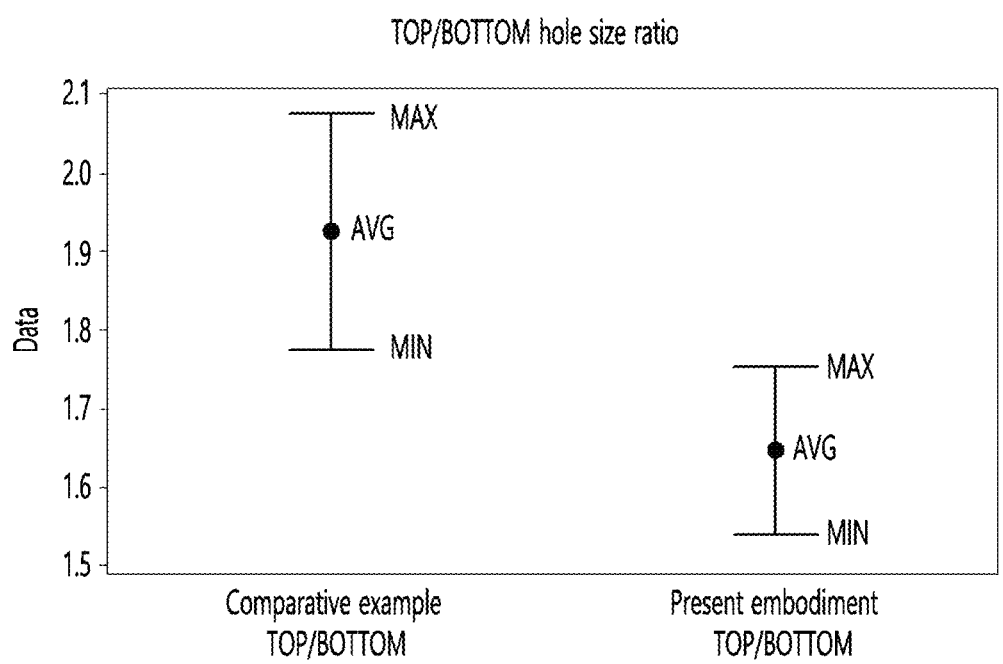

FIG. 18 is a view showing a comparison between a via hole formed according to an embodiment and a via hole of a comparative example.

According to the comparative example, the suction and fixation state of the panel PNL is more unstable than in the present embodiment, and accordingly, wrinkles occur in the panel PNL, and the flatness is low. Accordingly, according to the comparative example, it was confirmed that the difference between the upper width and the lower width of the via hole appears severely. In addition, according to the comparative example, it was confirmed that the distribution of the size of the via hole was large.

In general, it is ideal to form the upper and lower widths of the via holes equal to each other, but it is impossible to have the upper and lower widths substantially the same so that the cross section has a rectangular shape. Accordingly, it is important to minimize the difference between the upper and lower widths.

It was confirmed that the difference between the upper width and the lower width of the via hole according to the comparative example was very severe. That is, it was confirmed that the ratio of the difference between the upper width and the lower width of the via hole in the comparative example was up to 2.1.

Here, the difference ratio is a value obtained by dividing the upper width by the lower width. In this case, as the difference ratio is smaller, it means that there is no difference between the upper width and the lower width of the via hole. However, according to the comparative example, it was confirmed that the upper width of the via hole appeared up to 2.1 times the lower width.

In addition, it was confirmed that the via hole in the comparative example had a minimum of 1.78 or more of the difference ratio between the upper and lower widths. In other words, in the comparative example, it was confirmed that the difference ratio between the upper width and the lower width of the via hole was within the range of 1.78 to 2.1.

On the contrary, in the embodiment, it was confirmed that the difference ratio between the upper width and the lower width of the via hole was significantly reduced.

That is, it was confirmed that the ratio of the difference between the upper width and the lower width of the via hole according to the embodiment was 1.73 at the maximum. In other words, it was confirmed that the maximum value of the difference in size between the upper width and the lower width of the via hole according to the embodiment was smaller than the minimum value in the comparative example.

In addition, it was confirmed that the minimum value of the difference ratio between the upper width and the lower width of the via hole in the comparative example was 1.52. In other words, in the comparative example, it was confirmed that the difference ratio between the upper width and the lower width of the via hole was within the range of 1.52 to 1.73.

This confirmed that the ratio of the difference between the upper width and the lower width of the via hole in the embodiment was lower than that of the via hole in the comparative example, and the size distribution of the via hole was significantly lowered. That is, in the comparative example, the size distribution of via holes was severe (this means that the difference between the maximum value and the minimum value of the difference ratio is large), but in the embodiment, it was confirmed that the size distribution of the via holes was lowered (this means that the difference between the maximum value and the minimum value of the difference ratio is low), thereby improving the size uniformity of each via hole.

On the other hand, minimizing the difference between the upper and lower widths of the via hole and the uniformity of the size of the via hole may be achieved by changing the shape of the first suction hole formed in the jig or changing the material of the jig.

Figure 19:
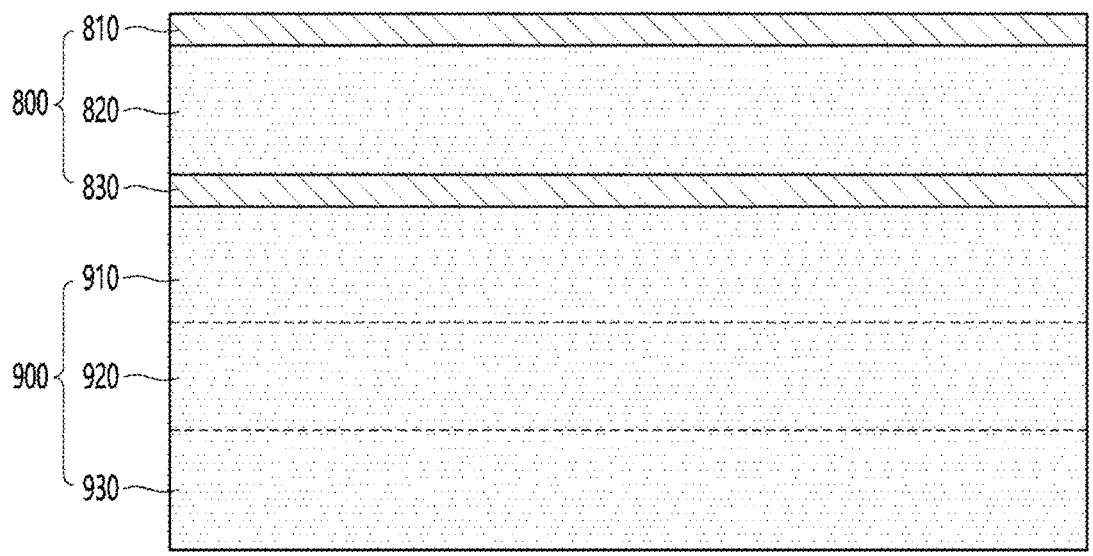
FIG. 19 is a view for describing a protective member according to an embodiment.

FIG. 19 is a view showing a protective member according to an embodiment, and FIGS. 20A to 20F are views showing reliability of the protective member of FIG. 19.

Referring to FIG. 19, when the via hole of the panel PNL is formed, a first protective member 900 may be disposed under the panel PNL.

In this case, the panel PNL may be the workpiece, which includes the insulating layer 820, the first metal layer 810 disposed on the upper surface of the insulating layer 820, and the second metal layer 830 disposed under the insulating layer 820.

Here, the first metal layer 810 and the second metal layer 830 may be copper foil layers attached to the upper and lower surfaces of the insulating layer 820, respectively.

That is, the insulating layer 820, the first metal layer 810, and the second metal layer 830 may be Copper Clad Laminate (CCL) constituting the panel PNL.

The insulating layer 820 may have a thickness between 30 μm and 50 μm. Preferably, the insulating layer 820 may have a thickness between 35 μm and 45 μm. More preferably, the insulating layer 820 may have a thickness of 40 μm±2 μm.

The first metal layer 810 and the second metal layer 830 may have the same thickness. The first metal layer 810 and the second metal layer 830 may be provided in a state attached to the surfaces of the insulating layer 820, respectively. The first metal layer 810 and the second metal layer 830 may have a thickness of 1 μm to 3 μm. Preferably, the first metal layer 810 and the second metal layer 830 may have a thickness of 1.5 μm to 2 μm.

Meanwhile, when a via hole is formed in the panel PNL, the first metal layer 810 and the second metal layer 830 disposed on the surface of the insulating layer 820 are not removed in order to protect the insulating layer 820, and the via hole machining proceeds.

That is, when a via hole is formed in the panel PNL, the via hole does not pass only the insulating layer 820, but the first metal layer 810 and the second metal layer 830 disposed on the surface of the insulating layer 820 is also formed through penetration. In other words, the via hole may penetrate from an upper surface of the first metal layer 810 to a lower surface of the second metal layer 830. However, this is only an embodiment and is not limited thereto. For example, any one of the first metal layer 810 and the second metal layer 830 disposed on the surface of the insulating layer 820 may be removed, and accordingly the via hole processing may be performed while only the other metal layer is present.

A first protective member 900 is attached under the panel PNL. Preferably, the first protective member 900 may be disposed between the panel PNL and the previously described jig.

In this case, the first protective member 900 may be attached under the panel PNL, or may be attached on the jig differently. However, as a result of the test, when the via hole processing of the panel PNL is performed while the first protective member 900 is attached to the jig, sufficient suction power was not provided, and accordingly, the reliability of the via hole is low. Accordingly, it is preferable that the first protective member 900 is attached under the panel PNL and then adsorbed and fixed on the jig rather than being attached to the jig.

The first protective member 900 may be an adhesive film attached under the panel PNL. Preferably, the first protective member 900 may be a release film attached under the panel PNL. In this case, the first protective member 900 may have a predetermined thickness and may be disposed under the panel PNL. Here, the thickness of the first protective member 900 may be determined by the thickness of the panel PNL. Preferably, the thickness of the first protective member 900 may be determined by the thickness of the insulating layer 820 constituting the panel PNL. More preferably, the thickness of the first protective member 900 may be determined by the total thickness of the metal layer disposed on at least one surface of the insulating layer 820.

That is, when a via hole is processed in a state in which the insulating layer 820, the first metal layer 810, and the second metal layer 830 are disposed, the processing condition (eg, laser light intensity) of the via hole is determined by the thickness of the first metal layer 810 and the second metal layer 830 rather than the thickness of the insulating layer 820. In other words, in order to penetrate the first metal layer 810 and the second metal layer 830, laser light having a greater intensity than that of the insulating layer 820 must be irradiated. Accordingly, when the via hole is formed in the insulating layer 820, the via hole processing condition is determined by the thickness of the first metal layer 810 and the second metal layer 830 rather than the thickness of the insulating layer 820.

In this case, the first protective member 900 may have a second thickness as a plurality of protective layers having a first thickness are laminated. Alternatively, the first protective member 900 may be formed of a single protective layer having a second thickness.

The first protective member 900 may be made of polyethylene terephthalate (PET). In this case, polyethylene terephthalate has a limited thickness, and thus, the thickness of one polyethylene terephthalate may be smaller than the second thickness that the first protective member 900. Accordingly, in an embodiment, the protective layer having the first thickness of the polyethylene terephthalate may be laminated into a plurality of layers so that the total thickness of the first protective member 900 has a second thickness greater than the first thickness.

To this end, the first protective member 900 may include a first protective layer 910, a second protective layer 920, and a third protective layer 930. In this case, the first to third protective layers 910, 920, and 930 may each have the same thickness. For example, the first to third protective layers 910, 920, and 930 may each have a thickness of 80 μm. At this time, in order to test the depth of the via hole according to the thickness of the first metal layer 810 and the second metal layer 830 included in the panel (PNL), the first protective member 900 may compose of three protective layers.

At this time, the first metal layer 810 and the second metal layer 830 each have a thickness of 1.5 μm, and accordingly, the depth of the via hole in the case of forming the via hole in the panel PNL was tested.

Referring to FIG. 20A is a photograph showing the upper surface of the second metal layer 830 appearing after via hole processing. Referring to FIG. 20A, it was confirmed that the via hole was normally processed in the second metal layer 830 during the via hole processing.

In addition, (B) is a photograph showing the lower surface of the second metal layer 830 appearing after the via hole processing. Referring to FIG. 16, it was confirmed that the via hole was normally processed also in the second metal layer 830 during the via hole processing. In other words, it was confirmed that the processed via hole was formed while passing the upper and lower surfaces of the second metal layer 830.

In addition, (C) is a view showing the upper surface of the first protective layer 910 appearing after via hole processing. Referring to FIG. 20C, when the via hole is processed in the panel PNL, it was confirmed that laser light was also provided to the first protective layer 910 constituting the first protective member 900, and accordingly, it was confirmed that a via hole was also formed in the first protective layer 910.

In addition, (D) is a view showing the upper surface of the second protective layer 920 appearing after via-hole processing. Referring to FIG. 20D, when the via hole is processed in the panel PNL, it was confirmed that laser light was also provided to the second protective layer 920 disposed under the first protective layer 910. This means that when a via hole is processed in the panel PNL, the via hole is formed pass through the first protective layer 910.

In addition, (E) is a view showing the upper surface of the third protective layer 930 appearing after via hole processing. Referring to FIG. 20E, when the via hole was processed in the panel PNL, it was confirmed that laser light was not provided to the third protective layer 930 disposed under the second protective layer 920. This means that when a via hole is processed in the panel PNL, the via hole is provided on the upper surface of the second protective layer 920, but does not pass through the second passivation layer 920.

Further, (F) is a view showing the upper surface of a jig (eg, an epoxy jig) that appears after via hole processing. It was also confirmed that laser light was not provided in FIG. 20F, and accordingly, it was confirmed that no damage was applied to the jig during the via hole processing.

According to the test results as described above, in the present invention, it was confirmed that the thickness of the first protective member 900 is at least 90 µm or more. This means that the thickness of the metal layer provided on the panel PNL is 3 µm. In other words, the metal layer provided in the panel PNL includes the first metal layer 810 and the second metal layer 830, and their total thickness is 3 µm. Accordingly, when the total thickness of the metal layer is 3 µm, the first protective member 900 may have a thickness of 90 µm to 240 µm. Preferably, the first protective member 900 may have a thickness of 90 µm to 200 µm. More preferably, the first protective member 900 may have a thickness of 90 µm to 160 µm.

In other words, when the via hole is processed while the first metal layer 810 and the second metal layer 830 as described above are disposed, the thickness of the first protective member 900 may be at least 30 times the total thickness of the metal layer. Preferably, the thickness of the first protective member 900 is 30 to 80 times the total thickness of the metal layer. More preferably, the first protective member 900 has a thickness of 30 to 60 times the total thickness of the metal layer.

When the first protective member 900 has a predetermined thickness according to the total thickness of the metal layer, the via hole does not penetrate the first protection member 900 when a via hole is processed in the panel PNL, and accordingly, damage is not applied to the epoxy jig. And, that no damage is applied to the epoxy jig means that the number of times of use of the epoxy jig can be increased.

In addition, as the via hole does not penetrate the first protection member 900, debris generated during the processing of the via hole is not transmitted to the epoxy jig. Accordingly, it is possible to inhibit a problem in which the debris accumulates in the epoxy jig or a reduction in suction power due to deformation of the suction hole of the epoxy jig.

In addition, when the via hole penetrates the first protection member 900, a loss of suction power provided by the epoxy jig may occur through the via hole formed as the via hole penetrates. On the contrary, in the embodiment, even after the via hole is processed, the suction force can be maintained to the maximum since the via hole is not formed between the first protection member 900 and the epoxy jig. Accordingly, the flatness of the panel (PNL) can be maintained.

Figure 21:
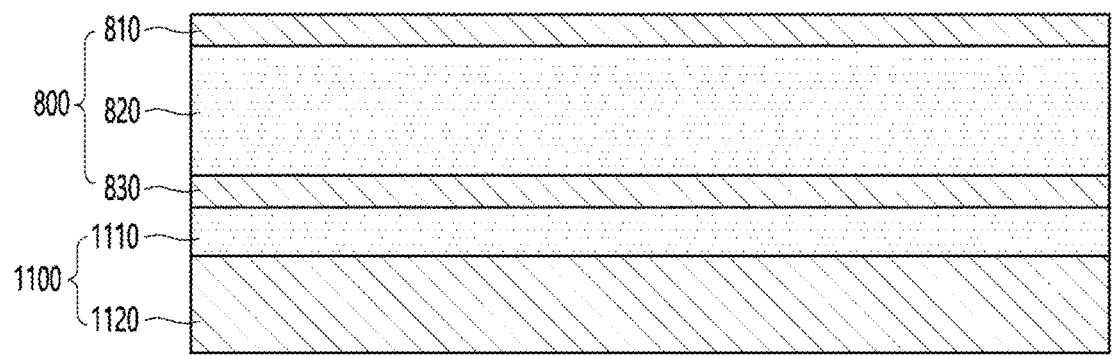
FIG. 21 is a view for describing a protective member according to another embodiment.

FIG. 21 is a view showing a protective member according to another embodiment, and FIGS. 22A to 22E are views showing reliability of the protective member of FIG. 21.

Referring to FIG. 21, when a via hole of the panel PNL is formed, a second protective member 1100 may be disposed under the panel PNL.

A second protective member 1100 is attached under the panel PNL. Preferably, the second protective member 1100 may be disposed between the panel PNL and the previously described jig.

In this case, the second protective member 1100 may be attached under the panel PNL, or may be attached to the jig differently. However, as a result of the test, when the via hole processing of the panel PNL is performed while the second protective member 1100 is attached to the jig, sufficient suction power was not provided, and accordingly, the reliability of the via hole is low. Accordingly, it is preferable that the second protective member 1100 is attached under the panel PNL and then adsorbed and fixed on the jig rather than being attached to the jig.

The second protective member 1100 may include an adhesive film 1110 attached under the panel PNL and a dummy metal layer 1120 attached under the adhesive film 1110.

The adhesive film 1110 may be a release film. That is, the adhesive film 1110 may be a double-sided release film for attaching the dummy metal layer 1120 under the panel PNL.

The dummy metal layer 1120 is disposed under the adhesive film 1110. Preferably, the dummy metal layer 1120 may be disposed between the epoxy jig and the panel PNL. In this case, the dummy metal layer 1120 may have a predetermined thickness and may be disposed under the panel PNL. Here, the thickness of the dummy metal layer 1120 may be determined by the thickness of the panel PNL. Preferably, the thickness of the dummy metal layer 1120 may be determined by the thickness of the insulating layer 820 constituting the panel PNL. More preferably, the thickness of the dummy metal layer 1120 may be determined by the total thickness of the metal layer disposed on at least one surface of the insulating layer 820.

That is, when a via hole is processed in a state in which the insulating layer 820, the first metal layer 810, and the second metal layer 830 are disposed, the processing condition (eg, laser light intensity) of the via hole is determined by the thickness of the first metal layer 810 and the second metal layer 830 rather than the thickness of the insulating layer 820. In other words, in order to penetrate the first metal layer 810 and the second metal layer 830, laser light having a greater intensity than that of the insulating layer 820 must be irradiated. Accordingly, when the via hole is formed in the insulating layer 820, the via hole processing condition is determined by the thickness of the first metal layer 810 and the second metal layer 830 rather than the thickness of the insulating layer 820.

In this case, the dummy metal layer 1120 may be formed of copper. Meanwhile, the first metal layer 810 and the second metal layer 830 each have a thickness of 1.5 and accordingly, the depth of the via hole in the case of forming the via hole in the panel PNL was tested.

FIG. 22A is a photograph showing the upper surface of the second metal layer 830 appearing after via-hole processing. Referring to FIG. 22A, it was confirmed that the via hole was normally processed in the second metal layer 830 during the via hole processing.

In addition, (B) is a photograph showing the lower surface of the second metal layer 830 appearing after the via hole processing. Referring to FIG. 18, it was confirmed that the via hole was normally processed also in the second metal layer 830 during the via hole processing. In other words, it was confirmed that the processed via hole was formed while passing the upper and lower surfaces of the second metal layer 830.

In addition, (C) is a figure which shows the upper surface of the adhesive film 1110 appearing after via-hole processing. Referring to FIG. 22C, it was confirmed that laser light was also provided to the adhesive film 1110 when processing a via hole in the panel PNL, and accordingly, it was confirmed that a via hole was also formed in the adhesive film 1110.

In addition, (D) is a view showing the upper surface of the dummy metal layer 1120 appearing after via-hole processing. Referring to FIG. 22D, when the via hole is processed in the panel PNL, it can be seen that laser light is also provided to the upper surface of the dummy metal layer 1020. This means that when a via hole is processed in the panel PNL, the via hole is formed pass through the adhesive film 1110.

Figure 22E:
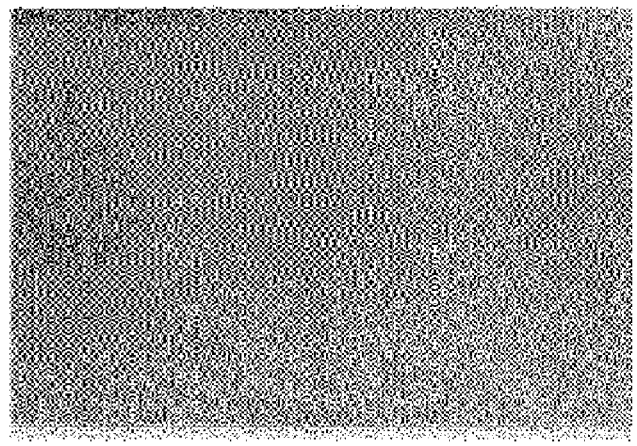

In addition, (E) is a view showing the lower surface of the dummy metal layer 1120 appearing after via-hole processing. Referring to FIG. 22E, when the via hole is processed in the panel PNL, it was confirmed that laser light was not provided to the lower surface of the dummy metal layer 1120. This means that when a via hole is processed in the panel PNL, the via hole is provided on the upper surface of the dummy metal layer 1120, but does not penetrate the dummy metal layer 1120.

According to the test results as described above, in the present invention, it was confirmed that the thickness of the dummy metal layer 1120 is at least 9 μm or more. This means that the thickness of the metal layer provided on the panel PNL is 3 μm. In other words, the metal layer provided in the panel PNL includes the first metal layer 810 and the second metal layer 830, and their total thickness is 3 μm. Accordingly, when the total thickness of the metal layer is 3 μm, the dummy metal layer 1120 may have a thickness of 9 μm to 24 μm. Preferably, the dummy metal layer 1120 may have a thickness of 12 μm to 21 μm. More preferably, the dummy metal layer 1020 may have a thickness of 15 μm to 18 μm.

In other words, when the via hole is processed while the first metal layer 810 and the second metal layer 830 are disposed, the thickness of the dummy metal layer 1120 is set to be at least three times the total thickness of the metal layer. Preferably, the thickness of the dummy metal layer 1120 is 3 to 8 times the total thickness of the metal layer. More preferably, the dummy metal layer 1120 has a thickness of 4 to 7 times the total thickness of the metal layer. More preferably, the thickness of the dummy metal layer 1120 is 5 to 6 times the total thickness of the metal layer.

On the other hand, when the panel PNL, which is the basis for manufacturing a printed circuit board, is provided, protective metal layers (not shown) are provided on both sides of the panel PNL to protect the metal layers disposed on both sides of the panel PNL. In this case, in the embodiment, the via hole is processed without removing the protective metal layer. In this case, the protective metal layer has a thickness of 18 μm. Accordingly, in an embodiment, the dummy metal layer 1020 may be formed by using the protective metal layer as it is, and accordingly, the dummy metal layer 1120 may have a thickness of 18 μm.

When the second protective member 1100 as described above has a predetermined thickness according to the total thickness of the metal layer, when a via hole is processed in the panel PNL, the via hole does not penetrate the second protective member 1100. And, accordingly, damage is not applied to the epoxy jig. And, that no damage is applied to the epoxy jig means that the number of times of use of the epoxy jig can be increased.

In addition, as the via hole does not penetrate the second protective member 1100, debris generated during the processing of the via hole is not transmitted to the epoxy jig. Accordingly, it is possible to inhibit a problem in which the debris accumulates in the epoxy jig or a reduction in suction power due to deformation of the suction hole of the epoxy jig. In addition, when the via hole penetrates the second protective member 1100, a loss of suction power provided by the epoxy jig may occur through the via hole formed as the via hole penetrates. On the contrary, in the embodiment, even after the via hole is processed, the suction force can be maintained to the maximum since the via hole is not formed between the second protective member 1100 and the epoxy jig. Accordingly, the flatness of the panel (PNL) can be maintained.

The invention claimed is:

1. A jig for processing a via hole comprising:
   an auxiliary member having a plate shape disposed between a processing plate in which a suction portion is disposed at a lower portion and a workpiece,
   wherein a plurality of first suction holes for sucking and supporting the workpiece by suction provided through the suction portion are formed in the auxiliary member,
   wherein each of the plurality of first suction holes comprises:
      a first hole portion extending in a first direction, and
      a second hole portion extending in a second direction different from the first direction,
   wherein the first direction is perpendicular to the second direction.

2. The jig of claim 1, wherein a center of the first hole portion is aligned with a center of the second hole portion in a same vertical line.

3. The jig of claim 1, wherein the first hole portion and the second hole portion have a length of 0.3 times to 0.5 times pitch between the plurality of first suction holes.

4. The jig of claim 3, wherein the first hole portion and the second hole portion have a length of 0.3 times to 0.5 times pitch between the plurality of second suction holes.

5. The jig of claim 3, wherein the processing plate comprises a plurality of second suction holes aligned with the first suction hole in a vertical line, and
   wherein a center of the second suction hole is aligned with a center of the first suction hole in the same vertical line, and
   wherein a shape of the first suction hole is different from a shape of the second suction hole.

6. The jig of claim 5, wherein the first hole portion and the second hole portion include an overlap region overlapping in a vertical direction, and
   wherein an area of the overlap region is smaller than an area of the second suction hole.

7. The jig of claim 5, wherein the first hole portion and the second hole portion have a length of 1.5 to 2.5 times a diameter of the second suction hole.

8. The jig of claim 1, wherein a length of the first hole portion is same as a length of the second hole portion.

9. The jig of claim 8, wherein the first hole portion and the second hole portion have a length in the range of 4.5 mm to 7.5 mm.

10. The jig of claim 1, wherein the first hole portion and the second hole portion have a hole width of 0.8 mm to 1.0 mm.

11. The jig of claim 1, wherein the first hole portion comprises:
a first sub-hole portion formed at one end of the first hole portion and concave toward a center direction of the first hole portion, and
a second sub-hole portion formed at an other end of the first hole portion and concave toward the center direction of the first hole portion.

12. The jig of claim 1, wherein the second hole portion comprises:
a third sub-hole portion formed at one end of the second hole portion and concave toward a center direction of the second hole portion, and
a fourth sub-hole portion formed at an other end of the second hole portion and concave toward the center direction of the second hole portion.

13. The jig of claim 1, wherein the auxiliary member is formed of an epoxy resin or a metal material of any one of copper, aluminum, and SUS.

14. A laser processing apparatus comprising:
a processing plate;
a suction portion disposed under the processing plate;
a jig disposed on the processing plate and having a plurality of first suction holes for sucking and supporting a workpiece; and
a head portion disposed on the jig and irradiating laser light to a position where a via hole is formed in the workpiece,
wherein the processing plate includes a plurality of second suction holes aligned with the first suction hole in a vertical line,
wherein a center of the second suction hole is aligned on the same vertical line as a center of the first suction hole,
wherein a shape of the first suction hole is different from a shape of the second suction hole, and
wherein each of the plurality of first suction holes includes:
a first hole portion extending in a first direction, and
a second hole portion extending in a second direction different from the first direction, and
wherein the first direction is perpendicular to the second direction.

15. A method of processing a via hole of a substrate comprising:
mounting a jig including a plurality of first suction holes on a processing plate;
fixing a workpiece on the jig using the plurality of first suction holes; and
forming a via hole in the work piece using a laser light,
wherein the workpiece includes
an insulating layer, and a panel including a metal layer attached to a surface of the insulating layer, and
a first protective member attached under the panel and disposed between the panel and the jig,
wherein the first protective member is a release film attached to a lower surface of the panel,
wherein the forming of the via hole comprises forming the via hole passing through the panel while not passing through the first protective member,
wherein each of the plurality of first suction holes comprises:
a first hole portion extending in a first direction, and
a second hole portion extending in a second direction different from the first direction, and
wherein the first direction is perpendicular to the second direction.

16. The method of claim 15, wherein a thickness of the first protective member is 30 times or more of a thickness of the metal layer constituting the panel.

17. The method of claim 16, wherein the metal layer comprises
a first metal layer disposed on an upper surface of the insulating layer, and
a second metal layer disposed on a lower surface of the insulating layer, and
wherein the thickness of the first protective member is 30 times or more of a total thickness of the first and second metal layers.

18. The method of claim 15, wherein the first protective member comprises:
a first protective layer disposed under the panel, and
a second protective layer disposed under the first protective layer.

* * * * *